United States Patent
Min et al.

(10) Patent No.: US 12,538,689 B2
(45) Date of Patent: Jan. 27, 2026

(54) COLOR CONVERSION SUBSTRATE AND DISPLAY DEVICE INCLUDING THE SAME

(71) Applicant: Samsung Display Co., LTD., Yongin-si (KR)

(72) Inventors: Kyounghae Min, Asan-si (KR); Jeongki Kim, Hwaseong-si (KR); Jong-Hoon Kim, Seoul (KR); Jiseong Yang, Suwon-si (KR); Hyejun Woo, Asan-si (KR); Myoungjong Lee, Cheonan-si (KR); Seongyeon Lee, Asan-si (KR); Sujin Lee, Hwaseong-si (KR); Si-Wan Jeon, Hwaseong-si (KR)

(73) Assignee: Samsung Display Co., LTD., Yongin-si (KR)

( * ) Notice: Subject to any disclaimer, the term of this patent is extended or adjusted under 35 U.S.C. 154(b) by 552 days.

(21) Appl. No.: 17/987,632

(22) Filed: Nov. 15, 2022

(65) Prior Publication Data

US 2023/0165104 A1    May 25, 2023

(30) Foreign Application Priority Data

Nov. 24, 2021 (KR) .................... 10-2021-0163707

(51) Int. Cl.
  *H10K 59/38* (2023.01)
  *G02B 5/20* (2006.01)
  *H10K 59/12* (2023.01)

(52) U.S. Cl.
  CPC .............. *H10K 59/38* (2023.02); *G02B 5/201* (2013.01); *H10K 59/12* (2023.02)

(58) Field of Classification Search
  CPC ......... H10K 59/38; H10K 59/12; G02B 5/201
  See application file for complete search history.

(56) References Cited

U.S. PATENT DOCUMENTS 11,456,338 B2    9/2022  Lee et al.
2017/0236879 A1  8/2017  Kubota
(Continued)

FOREIGN PATENT DOCUMENTS

CN        110504383 A    11/2019
KR     10-2017-0031613    3/2017
(Continued)

OTHER PUBLICATIONS

International Search Report dated Mar. 2, 2023, issued in International Application No. PCT/KR2022/018329 (3 pages).

*Primary Examiner* — Mary Ellen Bowman
(74) *Attorney, Agent, or Firm* — Womble Bond Dickinson (US) LLP

(57) ABSTRACT

A color conversion substrate includes first, second, and third light emitting areas, and a light blocking area surrounding the first, second, and third light emitting area, a first color filter layer overlapping the first light emitting area, and having a first opening exposing a portion of the substrate, a second color filter layer under the substrate and the first color filter layer, overlapping the second light emitting area, and having a second opening exposing a portion of the first color filter layer, and a third color filter layer under the substrate and the second color filter layer, overlapping the first light emitting area, and having a third opening exposing a portion of the second color filter layer and a fourth opening exposing a portion of the first color filter layer.

19 Claims, 21 Drawing Sheets

(56) References Cited

U.S. PATENT DOCUMENTS

2021/0249478 A1\* 8/2021 Oh .......................... H10K 59/38
2021/0351238 A1\* 11/2021 Park ..................... H10K 50/865
2021/0359011 A1   11/2021 Lee
2023/0371340 A1\* 11/2023 Shin ................... H10K 59/8792

FOREIGN PATENT DOCUMENTS

| KR | 10-2017-0050738 A | 5/2017 |
| KR | 10-2018-0003662   | 1/2018 |
| KR | 10-2020-0047947   | 5/2020 |
| KR | 10-2020-0135130   | 12/2020 |
| KR | 10-2021-0101380   | 8/2021 |

\* cited by examiner

COLOR CONVERSION SUBSTRATE AND DISPLAY DEVICE INCLUDING THE SAME

CROSS-REFERENCE TO RELATED APPLICATION

The present application claims priority to and the benefit of Korean Patent Application No. 10-2021-0163707, filed on Nov. 24, 2021, the entirety of which is hereby incorporated by reference for all purposes as if fully set forth herein.

BACKGROUND

1. Field

Aspects of some embodiments relate to a color conversion substrate.

2. Description of the Related Art

A flat panel display may be used as a display device, as a substitute for alternative display devices such as cathode ray display devices, due to characteristics such as being relatively light weight and thin. Representative examples of such flat panel display devices include liquid crystal devices (LCD devices) and organic light emitting display devices (OLED devices).

Recently, organic light emitting display devices, which include organic light emitting elements and a color conversion layer has been studied. The color conversion layer may convert a wavelength of light provided from the organic light emitting element. Accordingly, the organic light emitting display device may emit light having a color different from a color of an incident light.

The above information disclosed in this Background section is only for enhancement of understanding of the background and therefore the information discussed in this Background section does not necessarily constitute prior art.

SUMMARY

Aspects of some embodiments relate to a color conversion substrate. For example, aspects of some embodiments relate to a color conversion substrate and a display device including the same.

Aspects of some embodiments include a color conversion substrate that may reduce manufacturing costs.

Aspects of some embodiments include a display device including the color conversion substrate.

A color conversion substrate according to some embodiments of the present invention may include a substrate including first, second, and third light emitting areas, and a light blocking area surrounding the first, second, and third light emitting area, a first color filter layer under the substrate, overlapping the first light emitting area, and having a first opening and a second opening exposing a portion of the substrate, respectively, a second color filter layer under the substrate and the first color filter layer, overlapping the second light emitting area, and having a third opening exposing a portion of the substrate and a fourth opening exposing a portion of the first color filter layer, a third color filter layer under the substrate and the second color filter layer, overlapping the third light emitting area, and having a fifth opening exposing a portion of the second color filter layer and a sixth opening exposing a portion of the first color filter layer, and a color conversion layer overlapping the first, second, and third color filter layers under the first, second, and third color filter layers and including a color conversion particle. A first shortest distance from an end of the first opening to an end of the fifth opening may be different from a second shortest distance from an end of the fourth opening to an end of the sixth opening in a plan view.

According to some embodiments, the second shortest distance may be greater than the first shortest distance.

According to some embodiments, the first color filter layer, the second color filter layer, and the third color filter layer may partially overlap with each other in the light blocking area.

According to some embodiments, the first color filter layer, the second color filter layer, and the third color filter layer may transmit light of different colors with each other.

According to some embodiments, the first color filter layer may transmit blue light, the second color filter layer may transmit red light, and the third color filter layer may transmit green light.

According to some embodiments, the first opening may correspond to the second light emitting area, the second opening may correspond to the third light emitting area, and the fourth opening may correspond to the first light emitting area.

According to some embodiments, a portion of the third opening may overlap the third emitting area, a portion of the fifth opening may overlap the second emitting area, and a portion of the sixth opening may overlap the first emitting area.

According to some embodiments, a width of the first opening may be smaller than a width of the fifth opening, a width of the second opening may be smaller than a width of the third opening, and a width of the fourth opening may be smaller than a width of the sixth opening.

According to some embodiments, the first color filter layer may include a portion overlapping the first light emitting area and a portion overlapping the light blocking area. The second color filter layer may include a portion overlapping the second light emitting area and a portion overlapping a portion of the light blocking area. The third color filter layer may include a portion overlapping the third light emitting area and a portion overlapping a portion of the light blocking area.

According to some embodiments, the color conversion layer may include a first color conversion layer partially overlapping the second light emitting area, a second color conversion layer partially overlapping the third light emitting area, and a transmission layer partially overlapping the first light emitting area.

A color conversion substrate according to some embodiments of the present invention may include a substrate including first, second, and third light emitting areas, and a light blocking area surrounding the first, second, and third light emitting area, a first color filter layer under the substrate, overlapping the first light emitting area, and having a first opening exposing a portion of the substrate, a second color filter layer under the substrate and the first color filter layer, overlapping the second light emitting area, and having a second opening exposing a portion of the first color filter layer, and a third color filter layer under the substrate and the second color filter layer, overlapping the first light emitting area, and having a third opening exposing a portion of the second color filter layer and a fourth opening exposing a portion of the first color filter layer. A first shortest distance from an end of the first opening to an end of the third opening may be different from a second shortest distance from an end of the second opening to an end of the fourth opening in a plan view.

According to some embodiments, the second shortest distance may be greater than the first shortest distance.

According to some embodiments, the color conversion substrate may further include a color conversion layer overlapping the first, second, and third color filter layers under the first, second, and third color filter layers and including a color conversion particle.

According to some embodiments, a width of the first opening may be smaller than a width of the third opening and a width of the second opening may be smaller than a width of the fourth opening.

A display device according to some embodiments of the present invention may include an array substrate including a first substrate and a light emitting element on the first substrate, and a color conversion substrate on the array substrate and converting a wavelength of light emitted from the light emitting element. The color conversion substrate may include: a second substrate including first, second, and third light emitting areas, and a light blocking area surrounding the first, second, and third light emitting area, a first color filter layer under the second substrate, overlapping the first light emitting area, and having a first opening and a second opening exposing a portion of the second substrate, respectively, a second color filter layer under the second substrate and the first color filter layer, overlapping the second light emitting area, and having a third opening exposing a portion of the second substrate and a fourth opening exposing a portion of the first color filter layer, a third color filter layer under the second substrate and the second color filter layer, overlapping the third light emitting area, and having a fifth opening exposing a portion of the second color filter layer and a sixth opening exposing a portion of the first color filter layer, and a color conversion layer overlapping the first, second, and third color filter layers under the first, second, and third color filter layers and including a color conversion particle. A first shortest distance from an end of the first opening to an end of the fifth opening may be different from a second shortest distance from an end of the fourth opening to an end of the sixth opening in a plan view.

According to some embodiments, the second shortest distance may be greater than the first shortest distance.

According to some embodiments, a stacked portion in which the first color filter layer, the second color filter layer, and the third color filter layer are overlapped in the light blocking area may be defined as a light blocking layer.

According to some embodiments, the first color filter layer, the second color filter layer, and the third color filter layer may transmit light of different colors with each other.

According to some embodiments, the first opening may correspond to the second light emitting area, the second opening may correspond to the third light emitting area, and the fourth opening may correspond to the first light emitting area.

According to some embodiments, a portion of the third opening may overlap the third emitting area, a portion of the fifth opening may overlap the second emitting area, and a portion of the sixth opening may overlap the first emitting area.

According to some embodiments, the first color filter layer may include a portion overlapping the first light emitting area and a portion overlapping the light blocking area. The second color filter layer may include a portion overlapping the second light emitting area and a portion overlapping a portion of the light blocking area. The third color filter layer may include a portion overlapping the third light emitting area and a portion overlapping a portion of the light blocking area.

According to some embodiments, the light emitting element may emit light including blue light.

In a color conversion substrate and a display device including the same according to some embodiments of the present invention, a first color filter layer, a second color filter layer, and a third color filter layer that transmit light of different colors with each other may be sequentially arranged under a substrate. The first color filter layer may define a second light emitting area emitting red light and a third light emitting area emitting green light, and the third color filter layer may define a first light emitting area emitting blue light. In addition, a stacked portion in which the first, second, and third color filter layers are overlapped in the light blocking area may function as a light blocking layer. Accordingly, a manufacturing cost of the display device may be reduced.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
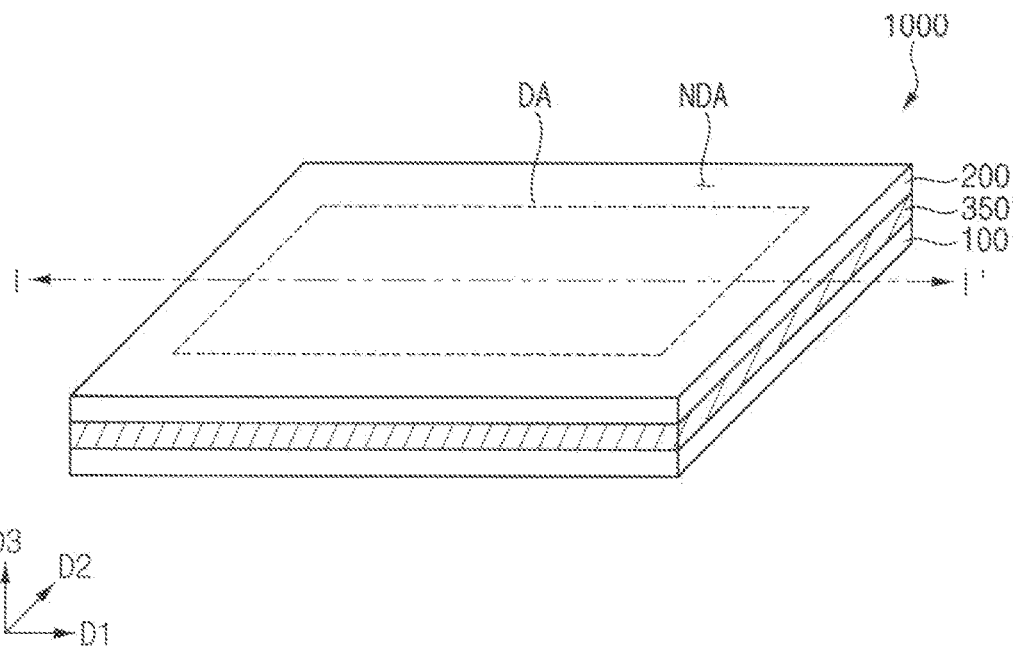
FIG. 1 is a perspective view illustrating a display device according to some embodiments.

Hereinafter, embodiments of the present disclosure will be explained in detail with reference to the accompanying drawings. The same reference numerals are used for the same components in the drawings, and redundant descriptions of the same components will be omitted.

Figure 2:
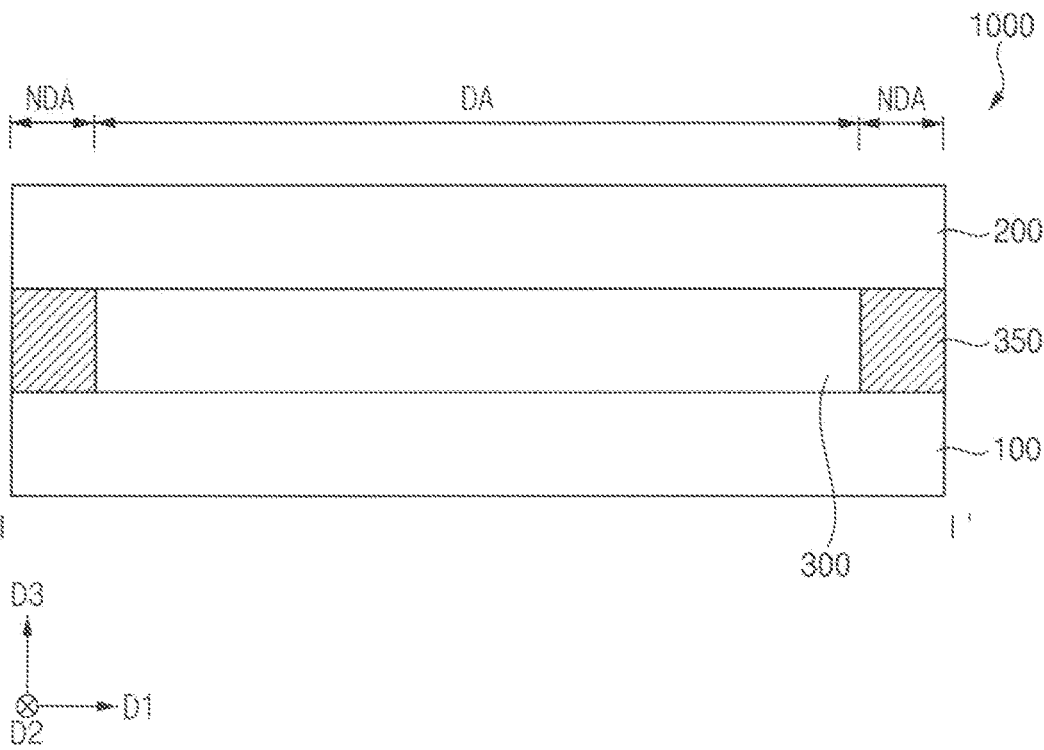
FIG. 2 is a cross-sectional view taken along the line I-I' of FIG. 1.

FIG. 1 is a perspective view illustrating a display device according to some embodiments. FIG. 2 is a cross-sectional view taken along the line I-I' of FIG. 1.

Referring to FIGS. 1 and 2, the display device 1000 according to some embodiments of the present invention may include an array substrate 100, a sealing portion 350, a filling layer 300, and a color conversion substrate 200.

The display device 1000 may have a rectangular planar shape. For example, the display device 1000 may include two first sides extending in a first direction D1 and two second sides extending in a second direction D2 perpendicular to the first direction D1. An edge where the first side and the second side meet may be a right angle. According to some embodiments, an edge where the first side and the second side of the display device 1000 meet may form a curved surface. Additionally, although the display device 1000 is illustrated and described as being rectangular in a plan view (e.g. a direction perpendicular or normal with respect to a plane of the display surface), in some embodiments, the display device 1000 may have any other suitable polygon shape in a plan view, or may have, for example, rounded corners, or curved edges.

The display device 1000 may be divided into a display area DA and a non-display area NDA. The display area DA may display images, and the non-display area NDA may not display an image. The non-display area NDA may be located around the display area DA. For example, the non-display area NDA may surround the display area DA. That is, the non-display area NDA may not have any pixels and may be for example, a bezel area.

The array substrate 100 may include a pixel array. Each pixel of the pixel array may include a light emitting element that generates light according to a driving signal.

The color conversion substrate 200 may be located on the array substrate 100. The color conversion substrate 200 may face the array substrate 100. The color conversion substrate 200 may include a color conversion layer that converts the wavelength of the light emitted from the light emitting element. In addition, the color conversion substrate 200 may include a color filter that transmits light having a specific color. A detailed description of the color conversion substrate 200 will be described later.

The sealing portion 350 may be located between the array substrate 100 and the color conversion substrate 200 in the non-display area NDA. The sealing portion 350 may be arranged along edges of the array substrate 100 and the color conversion substrate 200 in the non-display area NDA to surround the display area DA in a plan view. In addition, the array substrate 100 and the color conversion substrate 200 may be coupled to each other through the sealing portion 350. The sealing portion 350 may include an organic material. For example, the sealing portion 350 may include an epoxy-based resin and the like.

The filling layer 300 may be located between the array substrate 100 and the color conversion substrate 200. The filling layer 300 may fill a space between the array substrate 100 and the color conversion substrate 200. The filling layer 300 may include a material capable of transmitting light. For example, the filling layer 300 may include an organic material. Examples of the material that can be used for the filling layer 300 may include a silicone-based resin, an epoxy-based resin, and the like. These may be used alone or in combination with each other. According to some embodiments, the filling layer 300 may be omitted.

However, although the display device 1000 of the present invention is illustrated as being an organic light emitting display device (OLED), the configuration of embodiments according to the present invention is not limited thereto. In other embodiments, the display device 1000 may include a liquid crystal display device (LCD), a field emission display device (FED), a plasma display device (PDP), an electrophoretic display device (EPD), a quantum dot display device, or an inorganic light emitting display device. Hereinafter, an example in which the display device 1000 according to the present invention includes the organic light emitting display device will be described.

Figure 3:
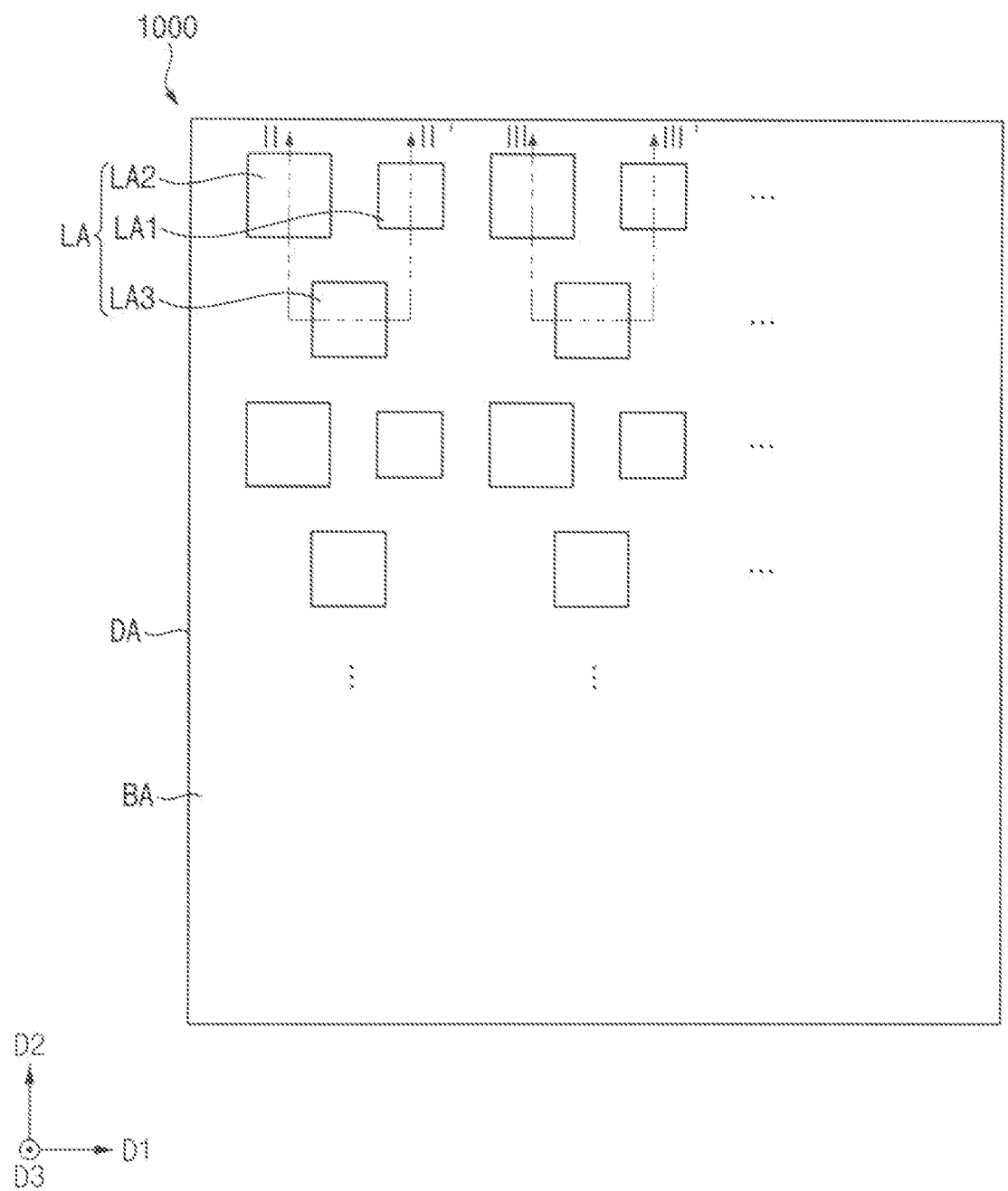
FIG. 3 is a plan view illustrating the display device of FIGS. 1 and 2.

FIG. 3 is a plan view illustrating the display device of FIGS. 1 and 2.

Referring to FIG. 3, the display area DA of the display device 1000 according to some embodiments may include light emitting areas LA and a light blocking area BA. Here, each of the light emitting areas LA may include a first light emitting area LA1, a second light emitting area LA2, and a third light emitting area LA3.

Each of the first light emitting area LA1, the second light emitting area LA2, and the third light emitting area LA3 may be an area in which light emitted from the light emitting element is emitted to an outside of the display device 1000. For example, the first light emitting area LA1 may emit a first light, the second light emitting area LA2 may emit a second light, and the third light emitting area LA3 may emit a third light. According to some embodiments, the first light may be blue light, the second light may be red light, and the third light may be green light. However, embodiments according to the present invention are not limited thereto. For example, the light emitting areas LA may be combined to emit yellow, cyan, and magenta lights.

In addition, the light emitting areas LA may emit light of four or more colors. For example, the light emitting areas LA may be combined to further emit at least one of yellow, cyan, or magenta lights in addition to red, green, and blue lights. In addition, the light emitting areas LA may be combined to further emit white light.

In a plan view, each of the first light emitting area LA1, the second light emitting area LA2, and the third light emitting area LA3 may be repeatedly arranged along a row direction and a column direction. For example, in the plan view, each of the first light emitting area LA1, the second light emitting area LA2, and the third light emitting area LA3 may be repeatedly arranged along the first direction D1 and the second direction perpendicular to the first direction D1. According to some embodiments, in the plan view, the second light emitting area LA2 and the first light emitting area LA1 may be repeatedly arranged in a first row of the display area DA, and the third light emitting area LA3 may be repeatedly arranged in a second row of the display area DA.

The first light emitting area LA1, the second light emitting area LA2, and the third light emitting area LA3 may have different sizes. According to some embodiments, an area of the second light emitting area LA2 emitting red light may be larger than an area of each of the first light emitting area LA1 emitting blue light and the third light emitting area LA3 emitting green light. In this case, the area of the third light emitting area LA3 may be larger than the area of the first light emitting area LA1. According to some embodiments, the area of the third light emitting area LA3 emitting green light may be larger than the area of each of the first light emitting area LA1 emitting blue light and the second light emitting area LA2 emitting red light. In this case, the area of the second light emitting area LA2 may be larger than the area of the first light emitting area LA1.

Each of the first light emitting area LA1, the second light emitting area LA2, and the third light emitting area LA3 has a triangular planar shape, a rectangular planar shape, a circular planar shape, a track-type planar shape, an elliptical planar shape, or the like. According to some embodiments, each of the first light emitting area LA1, the second light emitting area LA2, and the third light emitting area LA3 may have a rectangular planar shape.

The light blocking area BA may be located between the first light emitting area LA1, the second light emitting area LA2, and the third light emitting area LA3. For example, in the plan view, the light blocking area BA may surround the first light emitting area LA1, the second light emitting area LA2, and the third light emitting area LA3. The light blocking area BA may not emit light.

Figure 4:
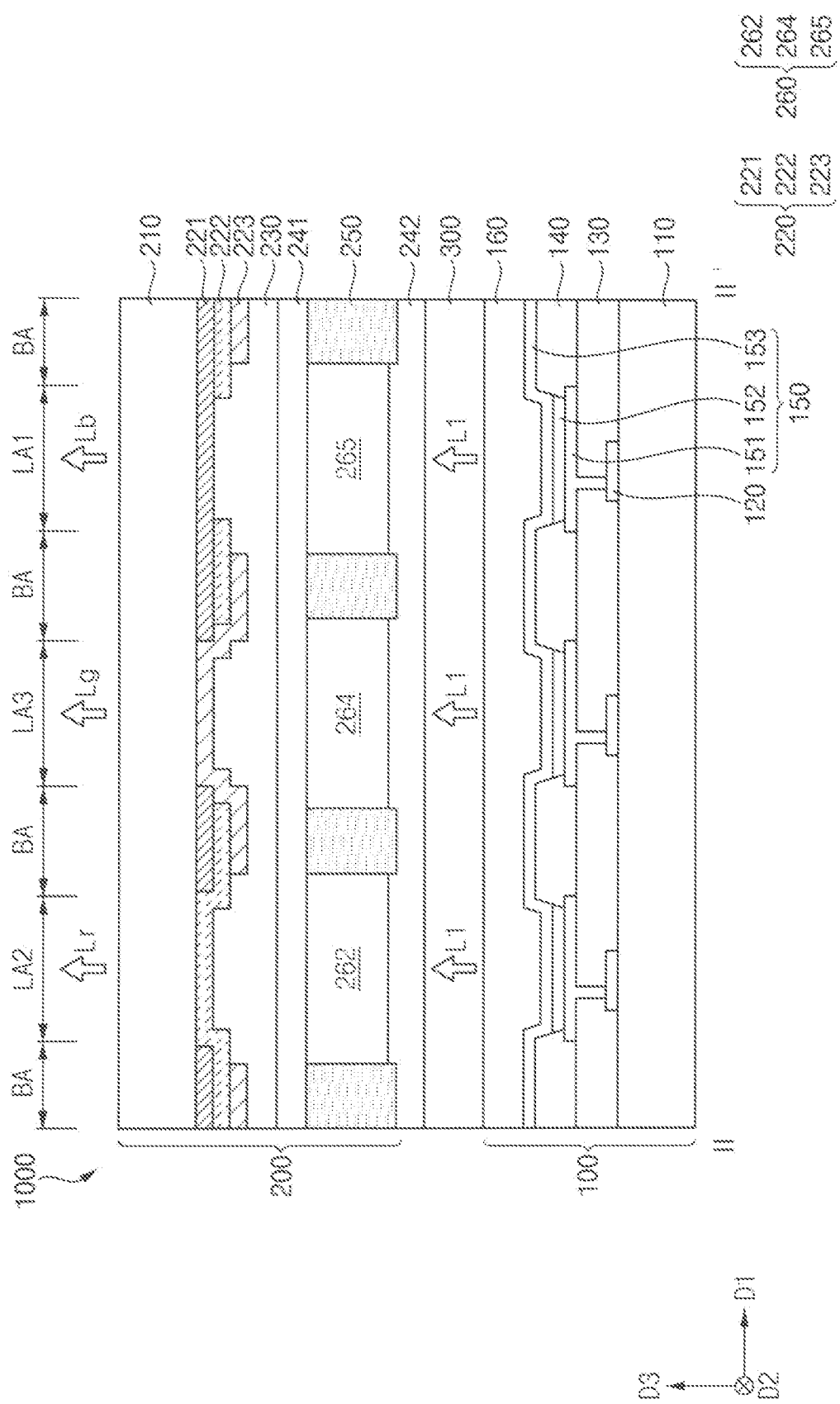
FIG. 4 is a cross-sectional view of the display device of FIGS. 1 and 2 taken along the line II-II' of FIG. 3.
Figure 5:
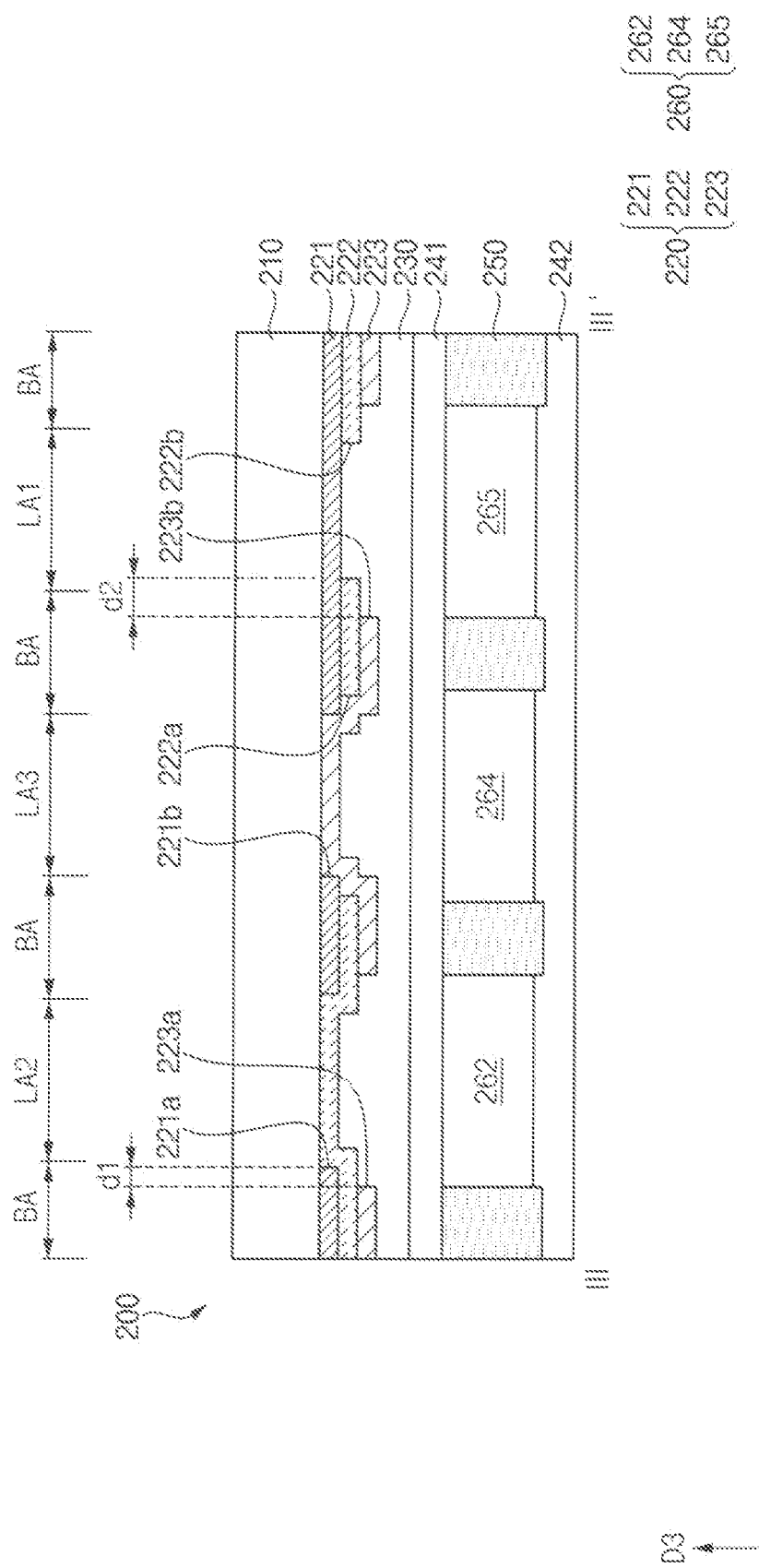
FIGS. 5 and 6 are cross-sectional views of the color conversion substrate of FIGS. 1 and 2 taken along the line III-III' of FIG. 3.

FIG. 4 is a cross-sectional view of the display device of FIGS. 1 and 2 taken along the line II-II' of FIG. 3. FIGS. 5 and 6 are cross-sectional views of the color conversion substrate of FIGS. 1 and 2 taken along the line III-III' of FIG. 3.

Referring to FIG. 4, as described above, the display device 1000 according to some embodiments includes the array substrate 100, the sealing portion 350, the filling layer 300, and the color conversion substrate 200. First, the array substrate 100 will be described.

The array substrate 100 may include a first substrate 110, a driving element 120, an insulating structure 130, a pixel defining layer 140, a light emitting element 150, and an encapsulation structure 160.

The first substrate 110 may include a transparent material or an opaque material. The first substrate 110 may be formed of a transparent resin substrate. An example of the transparent resin substrate that can be used as the first substrate 110 may include a polyimide substrate. In this case, the polyimide substrate may include a first organic layer, a first barrier layer, a second organic layer, and the like. According to some embodiments, the first substrate 110 may include a quartz substrate, a synthetic quartz substrate, a calcium fluoride substrate, a fluorine-doped quartz substrate, a soda-lime glass substrate, an alkali-free glass substrate, and the like. These may be used alone or in combination with each other.

The driving element 120 may be located on the first substrate 110. The driving element 120 may be electrically connected to the light emitting element 150. According to some embodiments, the driving element 120 may include a thin film transistor. For example, an active pattern of the driving element 120 may include amorphous silicon, polycrystalline silicon, or a metal oxide semiconductor.

For example, the metal oxide semiconductor may include a binary compound ($AB_x$), a ternary compound ($AB_xC_y$), a quaternary compound ($AB_xC_yD_z$), and the like containing indium (In), zinc (Zn), gallium (Ga), tin (Sn), titanium (Ti), aluminum (Al), hafnium (Hf), zirconium (Zr), magnesium (Mg), and the like. For example, the metal oxide semiconductor may include zinc oxide ($ZnO_x$), gallium oxide ($GaO_x$), tin oxide ($SnO_x$), indium oxide ($InO_x$), indium gallium oxide (IGO), indium zinc oxide (IZO), and indium tin oxide. (ITO), indium zinc tin oxide (IZTO), indium gallium zinc oxide (IGZO), and the like. These may be used alone or in combination with each other.

The insulating structure 130 may be located on the first substrate 110. The insulating structure 130 may cover the driving element 120. The insulating structure 130 may include a combination of at least one inorganic insulating layer and at least one organic insulating layer. For example, the inorganic insulating layer may include silicon oxide, silicon nitride, silicon carbide, silicon oxynitride, silicon oxycarbide, and the like. The organic insulating layer may include photoresist, polyacryl-based resin, polyimide-based resin, polyamide-based resin, siloxane-based resin, acryl-based resin, epoxy-based resin and the like. Each of these may be used alone or in combination with each other.

The first electrode 151 may be located in each of the light emitting areas LA1, LA2, and LA3 on the insulating structure 130. The first electrode 151 may be electrically connected to the driving element 120 through a contact hole formed by removing a portion of the insulating structure 130. The first electrode 151 may include a metal, an alloy, a metal nitride, a conductive metal oxide, a transparent conductive material, and the like. These may be used alone or in combination with each other. For example, the first electrode 151 may act as an anode.

The pixel defining layer 140 may be located in the light blocking area BA on the insulating structure 130 and the first electrode 151. The pixel defining layer 140 may cover both sides of the first electrode 151 and expose a portion of an upper surface of the first electrode 151. The pixel defining layer 140 may include an organic material or an inorganic material. Examples of the organic material that can be used for the pixel defining layer 140 may include photoresist, polyacrylic resin, polyimide-based resin, polyamide-based resin, siloxane-based resin, acrylic-based resin, epoxy-based resin, and the like. These may be used alone or in combination with each other.

The light emitting layer 152 may be located on the first electrode 151. A hole provided from the first electrode 151 and an electron provided from the second electrode 153 combine in the light emitting layer 152 to form an exciton, and as the exciton changes from an excited state to a ground state, the light emitting layer 152 may emit light. For example, the light emitting layer 152 may emit at least one of red light, green light, or blue light. According to some embodiments, the light emitting layer 152 may emit blue light L1.

The second electrode 153 may be located on the light emitting layer 152 and the pixel defining layer 140. The second electrode 153 may include a metal, an alloy, a metal nitride, a conductive metal oxide, a transparent conductive material, and the like. These may be used alone or in combination with each other. For example, the second electrode 153 may act as a cathode.

Accordingly, the light emitting element 150 including the first electrode 151, the light emitting layer 152, and the second electrode 153 may be located on the first substrate 110. The light emitting element 150 may be located in each of the first light emitting area LA1, the second light emitting area LA2, and the third light emitting area LA3. The light emitting element 150 may provide light to the color conversion substrate 200. According to some embodiments, the light emitting element 150 may include a blue light emitting element emitting blue light L1.

The encapsulation structure 160 may be located on the second electrode 153. The encapsulation structure 160 may prevent or reduce instances of impurities, moisture, or other contaminants penetrating into the light emitting element 150 from the outside. The encapsulation structure 160 may include at least one inorganic encapsulation layer and at least one organic encapsulation layer. For example, the inorganic encapsulation layer may include silicon oxide, silicon nitride, silicon oxynitride, and the like, and the organic encapsulation layer may include a cured polymer such as polyacrylate, and the like.

The filling layer 300 may be located between the color conversion substrate 200 and the array substrate 100. The filling layer 300 may include a material capable of transmitting light. The filling layer 300 may be formed to maintain a filling gap between the color conversion substrate 200 and the array substrate 100. For example, the filling layer 300 may include an organic material. According to some embodiments, the filling layer 300 may be omitted.

Hereinafter, the color conversion substrate 200 will be described.

Figure 6:
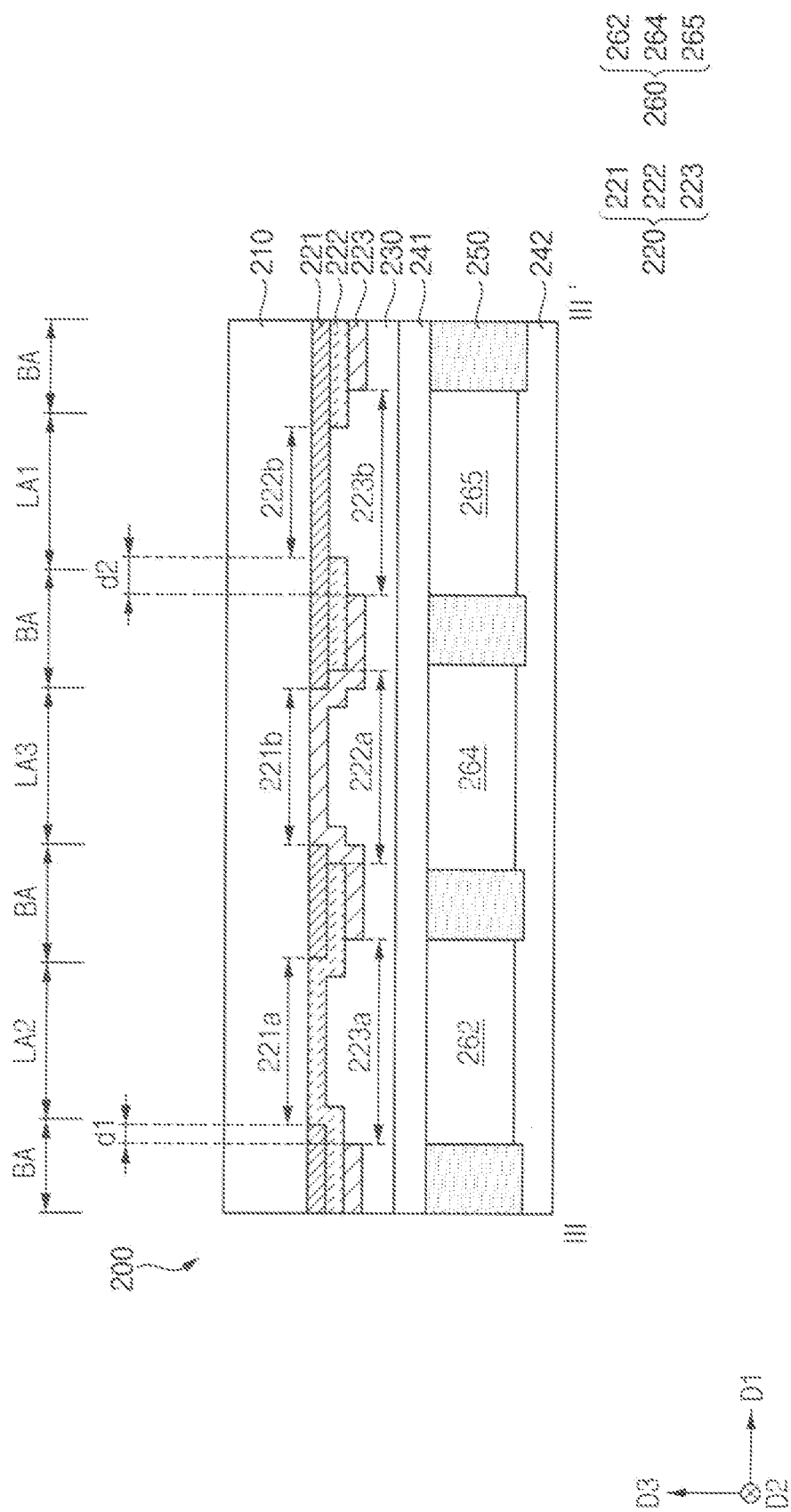

Referring to FIGS. 4, 5 and 6, the color conversion substrate 200 according to some embodiments of the present invention may include a second substrate 210, a color filter layer 220, a low refractive index layer 230, a first protection layer 241, a color conversion layer 260, a bank structure 250, and a second protection layer 242.

The color conversion substrate 200 may be located on the array substrate 100. The color conversion substrate 200 and the array substrate 100 may be combined.

As described above, the display area DA of the display device 1000 may include the first, second, and third light emitting areas LA1, LA2, and LA3 and the light blocking area BA. Accordingly, the second substrate 210 may also include the first, second, and third light emitting areas LA1, LA2, and LA3 and the light blocking area BA.

The second substrate 210 may transmit light emitted from the light emitting element 150. For example, the second substrate 210 may be formed of a transparent resin substrate. The second substrate 210 may include an insulating material such as glass or plastic. Alternatively, the second substrate 210 may include an organic polymer material such as polycarbonate, polyethylene, polypropylene, and the like.

The color filter layer 220 may be located under the second substrate 210. The color filter layer 220 may selectively transmit light having a specific wavelength.

According to some embodiments, the color filter layer 220 may include a first color filter layer 221, a second color filter layer 222, and a third color filter layer 223. The colors of the light Lr, Lg, and Lb emitted from the first light emitting area LA1, the second light emitting area LA2, and the third light emitting area LA3 may be determined by the first color filter layer 221, the second color filter layer 222 and the third color filter layer 223.

The first color filter layer 221, the second color filter layer 222, and the third color filter layer 223 may transmit light of different colors with each other. According to some embodiments, the first color filter layer 221 may overlap the first light emitting area LA1. For example, the first color filter layer 221 may transmit blue light Lb. The second color filter layer 222 may overlap the second light emitting area LA2. For example, the second color filter layer 222 may transmit red light Lr. The third color filter layer 223 may overlap the third light emitting area LA3. For example, the third color filter layer 223 may transmit green light Lg.

The first color filter layer 221 may include a first transmitting portion overlapping the first light emitting area LA1 and a first light blocking portion overlapping the light blocking area BA. According to some embodiments, the first light blocking portion of the first color filter layer 221 may be entirely located in the light blocking area BA.

The second color filter layer 222 may include a second transmitting portion overlapping the second light emitting area LA2 and a second light blocking portion overlapping a portion of the light blocking area BA. In addition, the third color filter layer 223 may include a third transmitting portion overlapping the third light emitting area LA3 and a third light blocking portion overlapping a portion of the light blocking area BA.

According to some embodiments, the first color filter layer 221, the second color filter layer 222, and the third color filter layer 223 may partially overlap with each other in the light blocking area BA.

The first color filter layer 221 may have a first opening 221a and a second opening 221b. The second color filter layer 222 may have a third opening 222a and a fourth opening 222b. The third color filter layer 223 may have a fifth opening 223a and a sixth opening 223b.

According to some embodiments, each of the first opening 221a and the second opening 221b may expose a portion of the second substrate 210. In addition, the third opening 222a may expose a portion of the second substrate 210 and the fourth opening 222b may expose a portion of the first color filter layer 221. In addition, the fifth opening 223a may expose a portion of the second color filter layer 222 and the sixth opening 223b may expose a portion of the first color filter layer 221.

A portion of the third opening 222a may overlap the third light emitting area LA3, a portion of the fifth opening 223a may overlap the second light emitting area LA2, and a portion of the sixth opening 223b may overlap the first light emitting area LA1.

According to some embodiments, the first opening 221a may correspond to the second light emitting area LA2, the second opening 221b may correspond to the third light emitting area LA3, and the fourth opening 222b may correspond to the first light emitting area LA1. Accordingly, the first color filter layer 221 may define the second light emitting area LA2 and the third light emitting area LA3, respectively, and the second color filter layer 222 may define the first light emitting area LA1.

As a width of each of the first opening 221a and the fifth opening 223a varies, an opening ratio of the first opening 221a may change. In addition, as a width of each of the fourth opening 222b and the sixth opening 223b varies, an opening ratio of the fourth opening 222b may change.

Hereinafter, a luminous efficiency of the light emitting areas LA1, LA2, and LA3 as an opening ratio of each of the first opening 221a and the fourth opening 222b are changed was evaluated.

As a result, when the width of each of the first opening 221a and the fifth opening 223a is changed and the opening ratio of the first opening 221a is changed by about 1%, luminous efficiency of the second light emitting area LA2 was changed by about 0.67%. In addition, when the width of each of the fourth and sixth openings 222b and 223b is changed and the opening ratio of the fourth opening 222b is changed by about 1%, luminous efficiency of the first light emitting area LA1 was changed by about 0.36%. Through this, that when the opening ratio of an opening corresponding to a light emitting area is changed, luminous efficiency of the light emitting area is reduced may be confirmed.

Accordingly, in order to prevent reduction in luminous efficiency of the light emitting areas LA1, LA2, and LA3, the width of the first opening 221a may be smaller than the width of the fifth opening 223a and the width of the second opening 221b may be smaller than the width of the third opening 222a. In addition, the width of the fourth opening 222b may be smaller than the width of the sixth opening 223b.

In addition, in the plan view, a first shortest distance d1 from an end of the first opening 221a to an end of the fifth opening 223a may be different from a second shortest distance d2 from an end of the fourth opening 222b to an end of the sixth opening 223b. According to some embodiments, in the plan view, the second shortest distance d2 may be greater than the first shortest distance d1. For example, the first shortest distance d1 may be about 4.9 μm and the second shortest distance d2 may be about 5.5 μm.

Hereinafter, numerical value of each of the first shortest distance d1 and the second shortest distance d2 will be described.

The first shortest distance d1 may be determined in consideration of the width of the first opening 221a, the width of the fifth opening 223a, and an overlay deviation between an end of the first opening 221 and an end of the fifth opening 223a.

The second shortest distance d2 may be determined in consideration of the width of the fourth opening 222b, the width of the sixth opening 223b, an overlay deviation between an end of the first color filter layer 221 and an end of the fourth opening 222b, and an overlay deviation between an end of the first color filter layer 221 and an end of the sixth opening 223b.

When two or more layers overlapping each other are formed, in a case where each layer is shifted in the up, down, left, or right directions, an overlapping area may become different from an initially designed overlapping area. Here, the overlay deviation may denote a difference between these overlapping areas.

The width of the first opening 221a was varied by about 3 µm. The width of the fifth opening 223a was varied by about 3 µm. In addition, the overlay deviation between the end of the first opening 221a and the end of the fifth opening 223a was varied by about 2.4 µm. Reflecting this, the first shortest distance d1 was derived to be about 4.9 µm.

The width of the fourth opening 222b was varied by about 3 µm. The width of the sixth opening 223b was varied by about 3 µm. In addition, the overlay deviation between the end of the first color filter layer 221 and the end of the fourth opening 222b was varied by about 2.4 µm. The overlay deviation between the end of the first color filter layer 221 and the end of the sixth opening 223b was varied by about 2.4 µm. Reflecting this, the second shortest distance d2 was derived to be about 5.5 µm.

Through this, that the first shortest distance d1 is different from the second shortest distance d2 in the plan view may be confirmed. In addition, that the second shortest distance d2 is greater than the first shortest distance d1 in the plan view may be confirmed.

Referring back to FIGS. 4, 5 and 6, a light blocking layer may be located under the second substrate 210. The light blocking layer may overlap the light blocking area BA. Light emitted from the color conversion layer 260 may transmit only a partial area of the second substrate 210. That is, light emitted from the color conversion layer 260 may transmit only an area of the second substrate 210 overlapping the light emitting areas LA1, LA2, and LA3, and not transmit an area of the second substrate 210 overlapping the light blocking area BA.

According to some embodiments, the light blocking layer may be defined as a stacked portion by overlapping the first color filter layer 271, the second color filter layer 272, and the third color filter layer 273 in the light blocking area BA. Alternatively, the light blocking layer may be defined as a portion of the first color filter layer 271 overlapping the light blocking area BA.

The light blocking layer may include a light blocking material. For example, the light blocking material may have a specific color. According to some embodiments, the light blocking material may have a blue color.

The low refractive index layer 230 may be located under the color filter layer 220. The low refractive index layer 230 may cover the color filter layer 220. The low refractive index layer 230 may have a relatively low refractive index. For example, a refractive index of the low refractive index layer 230 may be lower than a refractive index of the color conversion layer 260. The low refractive index layer 230 may include an organic material. For example, the low refractive index layer 230 may include an organic polymer material including silicon.

The first protection layer 241 may be located under the low refractive index layer 230. The first protection layer 241 may cover the low refractive index layer 230. The first protection layer 241 may block external impurities to prevent or reduce contamination of the color filter layer 220. The first protection layer 241 may include an inorganic material. For example, the first protection layer 241 may include silicon oxide, silicon nitride, aluminum nitride, and the like. These may be used alone or in combination with each other.

The bank structure 250 may be located under the first protection layer 241. The bank structure 250 may surround the color conversion layer 260. A space for accommodating an ink composition may be formed in the bank structure 250 in a process of forming the color conversion layer 260. Accordingly, the bank structure 250 may have a grid shape or a matrix shape in the plan view.

For example, the bank structure 250 may include an organic material such as an epoxy-based resin, a phenolic resin, an acrylic resin, a silicone-based resin, and the like. These may be used alone or in combination with each other. According to some embodiments, the bank structure 250 may include a light blocking material to serve as a black matrix. For example, at least a portion of the bank structure 250 may include a light blocking material such as pigment, dye, carbon black, and the like. In addition, the bank structure 250 may overlap a portion of the light blocking area BA.

The color conversion layer 260 may be located under the first protection layer 241. The color conversion layer 260 may overlap the color filter layers 221, 222, and 223. The color conversion layer 260 may convert light emitted from the light emitting element 150 into light having a specific wavelength. For example, the color conversion layer 260 may include a color conversion particle.

The color conversion layer 260 may include a first color conversion layer 262, a second color conversion layer 264, and a transmission layer 265. The first color conversion layer 262 may partially overlap the second light emitting area LA2, the second color conversion layer 264 may partially overlap the third light emitting area LA3, and the transmission layer 265 may partially overlap the first light emitting area LA1.

The first color conversion layer 262 may convert light L1 emitted from the light emitting element 150 into the light Lr of a first color. The second color conversion layer 264 may convert light L1 emitted from the light emitting element 150 into the light Lg of a second color. The transmission layer 265 may transmit light L1 emitted from the light emitting element 150. According to some embodiments, the first color may be red, and the second color may be green. In addition, the transmission layer 265 may transmit the blue light Lb.

The first color conversion layer 262 may include a first color conversion particle that is excited by the light L1 generated from the light emitting element 150 to emit the light of the first color (e.g., the red light Lr). In addition, the first color conversion layer 262 may further include a first photosensitive polymer in which first scattering particles are dispersed.

The second color conversion layer 264 may include a second color conversion particle that is excited by the light L1 generated from the light emitting element 150 to emit the light of the second color (e.g., the green light Lg). In addition, the second color conversion layer 264 may further include a second photosensitive polymer in which second scattering particles are dispersed. Each of the first color conversion particle and the second color conversion particle may denote a quantum dot.

The transmission layer 265 may transmit the light L1 generated from the light emitting element 150 and emit the light L1 toward the second substrate 210. The transmission layer 265 may include a third photosensitive polymer in which third scattering particles are dispersed. For example, each of the first, second, and third photosensitive polymers may include an organic material having light transmittance, such as a silicone resin, an epoxy resin, and the like. The first, second, and third photosensitive polymers may include the same material. The first, second, and third scattering particles may scatter and emit the light L1 generated from the light emitting element 150, and the first, second, and third scattering particles may include the same material.

Accordingly, the first light emitting area LA1 may emit the blue light Lb, the second light emitting area LA2 may emit the red light Lr, and the third light emitting area LA3 may emit the green light Lg.

The second protection layer 242 may be located under the bank structure 250 and the color conversion layer 260. The second protection layer 242 may cover the color conversion layer 260 and the bank structure 250. For example, the second protection layer 242 may include an inorganic material. For example, the second protection layer 242 may include silicon oxide, silicon nitride, aluminum nitride, and the like. These may be used alone or in combination with each other.

In the color conversion substrate 200 according to some embodiments of the present invention, the first color filter layer 221, the second color filter layer 222 and the third color filter layer 223 for transmitting light of different colors may be sequentially located under the second substrate 210. The first opening 221a of the first color filter layer 221 may correspond to the second light emitting area LA2, the second opening 221b of the first color filter layer 221 may correspond to the third light emitting area LA3, and the fourth opening 222b of the second color filter layer 222 may correspond to the first light emitting area LA1. In addition, a stacked portion in which the first to third color filter layers 221, 222, and 223 are overlapped in the light blocking area BA may function as the light blocking layer. Accordingly, a manufacturing cost of the display device 1000 may be reduced.

Figure 7:
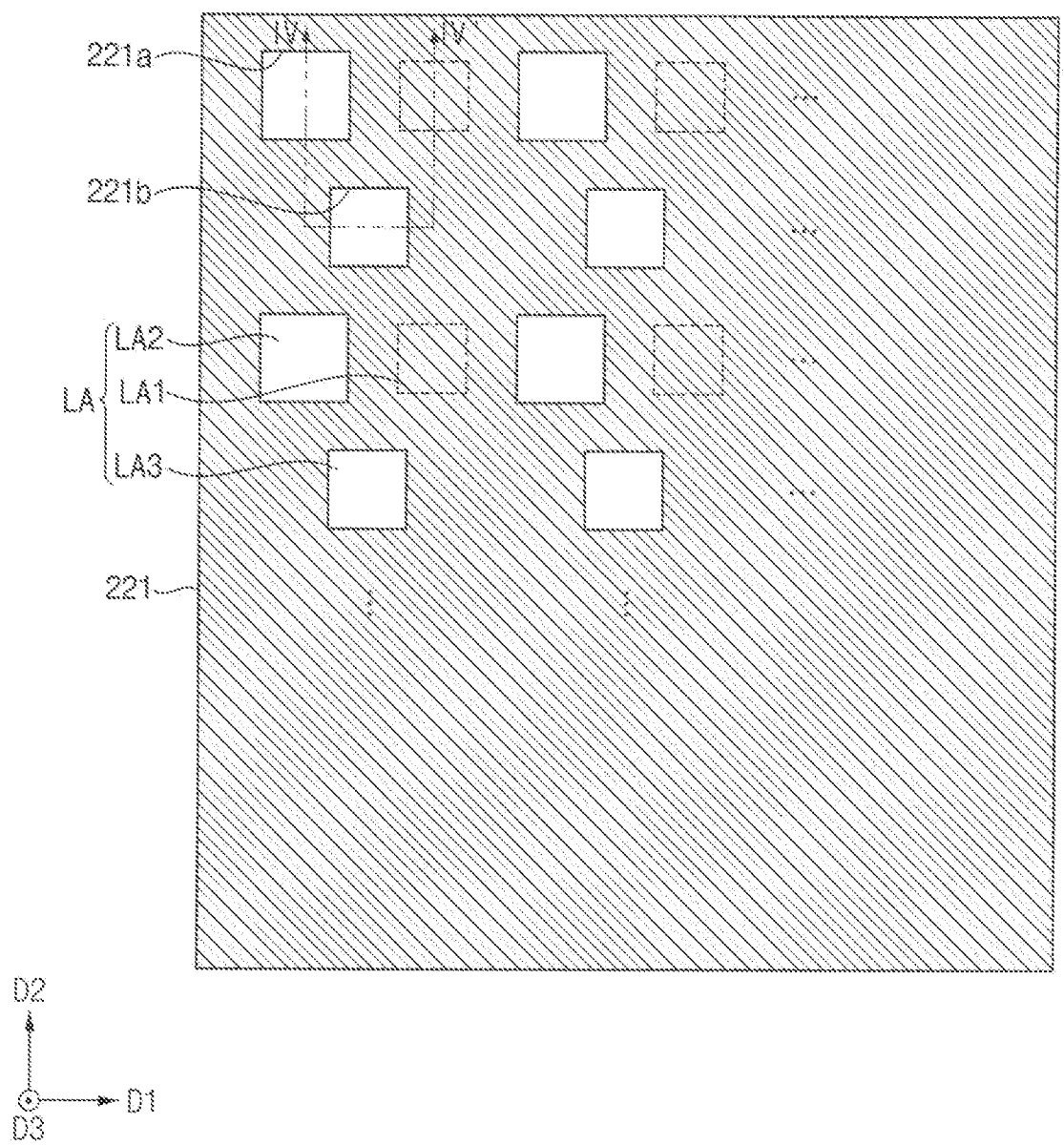
FIGS. 7, 8, 9, 10, 11, 12, 13 and 14 are views illustrating a method of manufacturing the color conversion substrate of FIGS. 5 and 6.
Figure 8:
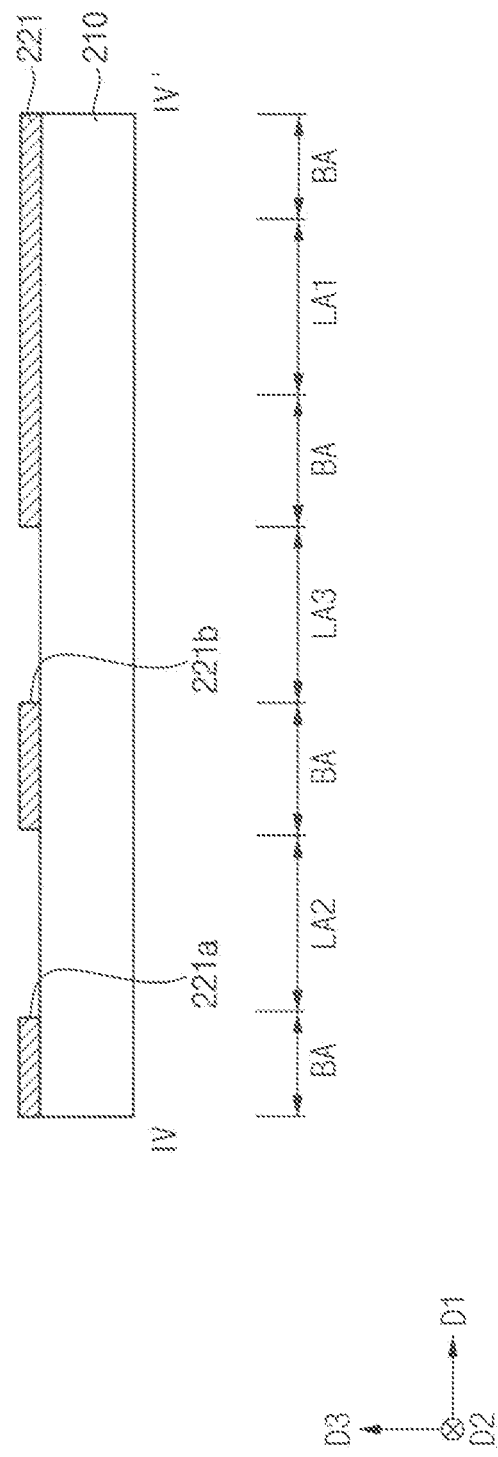
Figure 9:
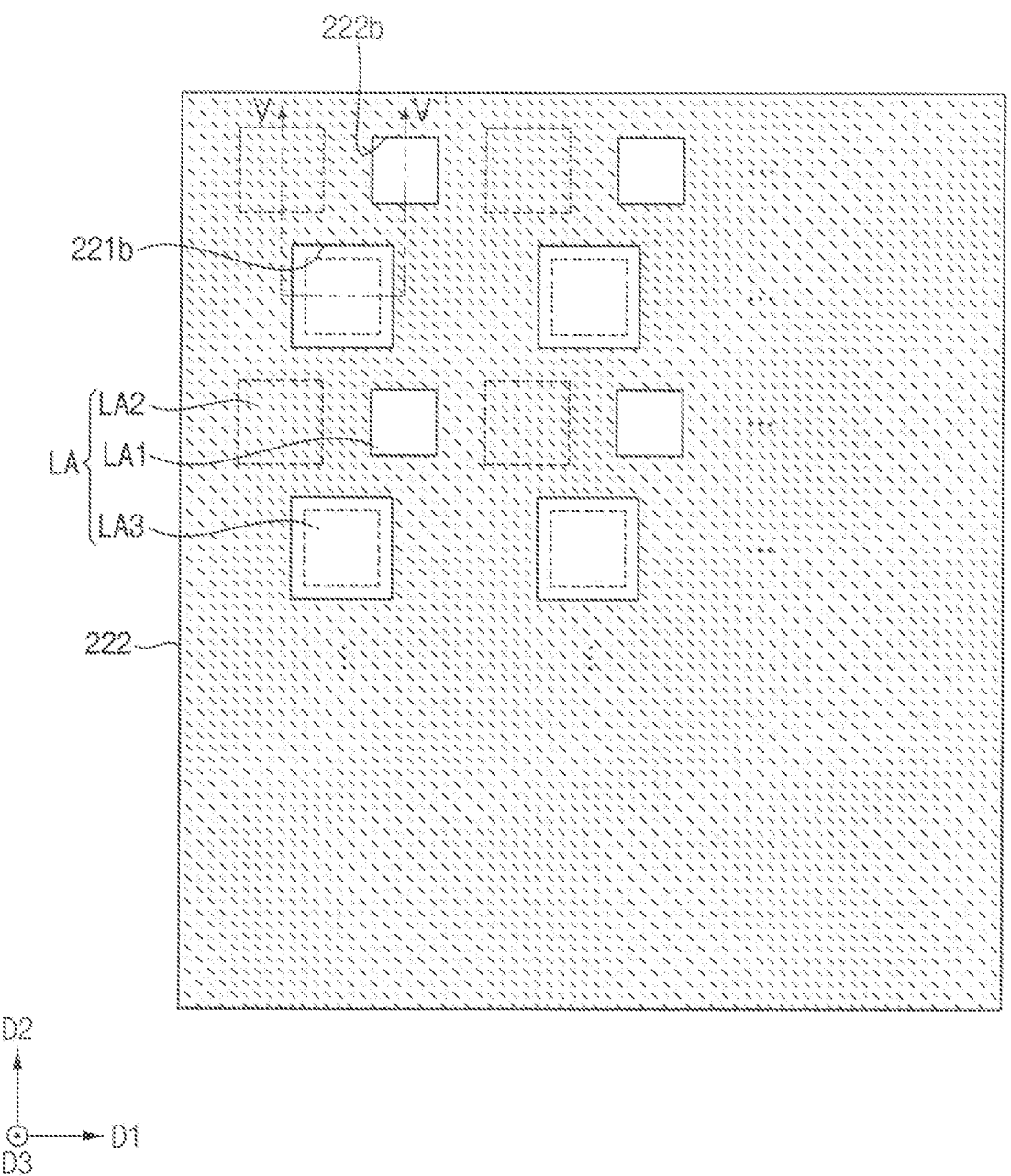
Figure 10:
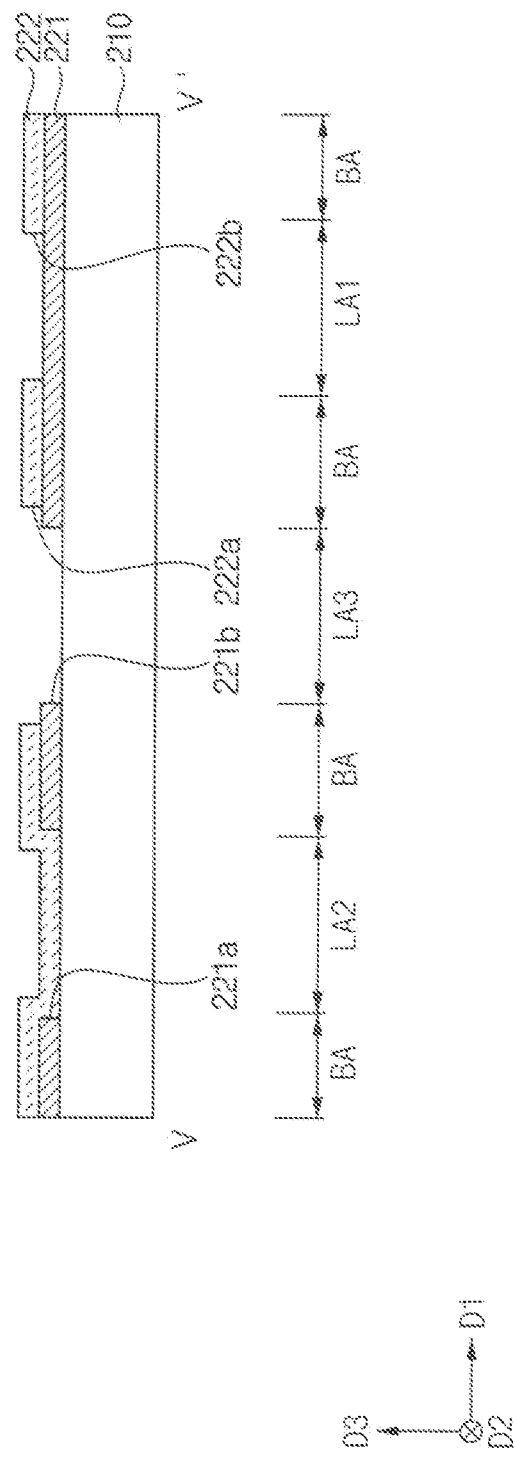
Figure 11:
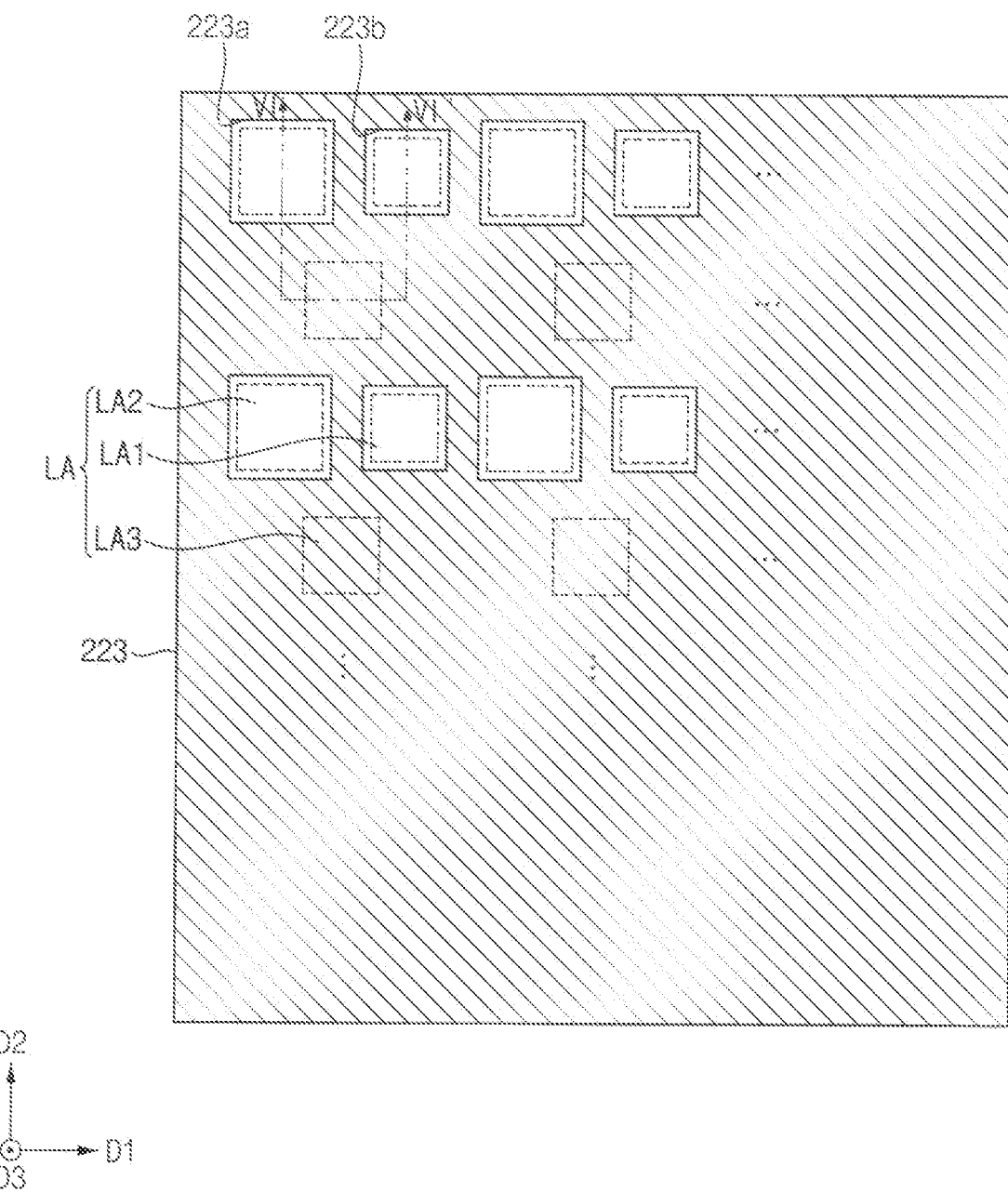
Figure 12:
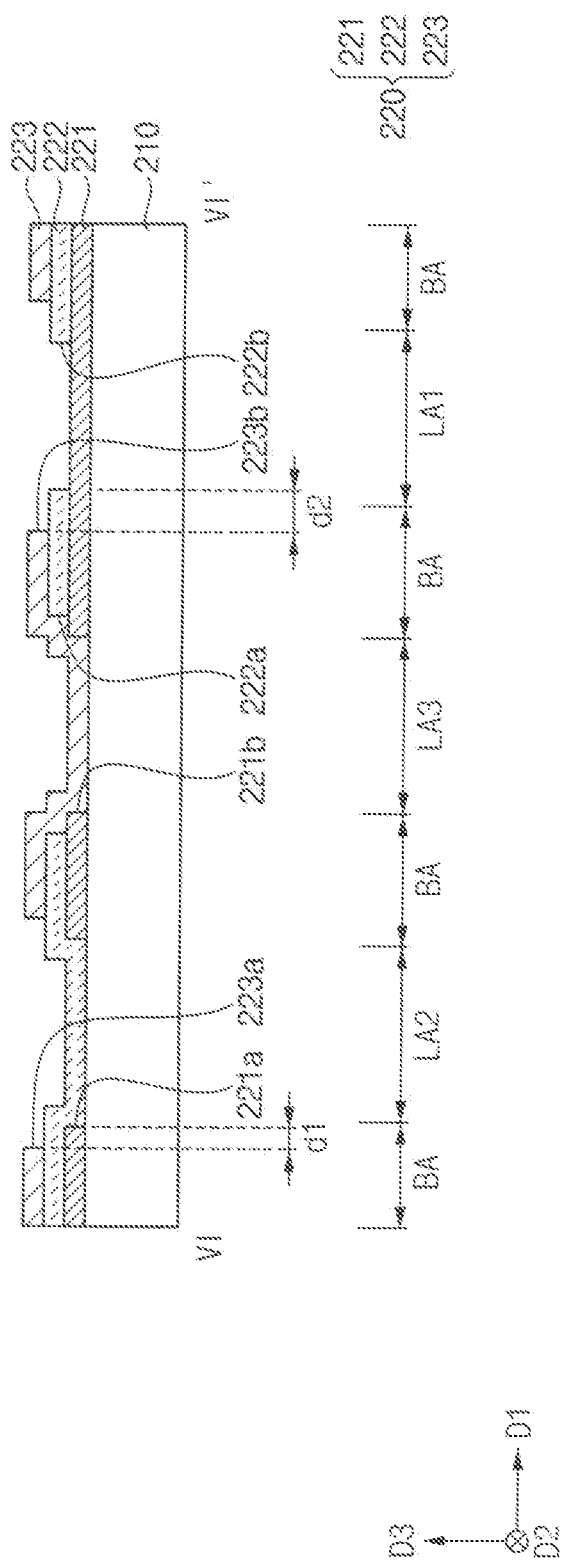

FIGS. 7, 8, 9, 10, 11, 12, 13 and 14 are views illustrating a method of manufacturing the color conversion substrate of FIGS. 5 and 6. For example, FIG. 8 is a cross-sectional view of the first color filter layer 221 of FIG. 7 taken along the line IV-IV'. FIG. 10 is a cross-sectional view of the second color filter layer 222 of FIG. 9 taken along the line V-V'. FIG. 12 is a cross-sectional view of the third color filter layer 223 of FIG. 11 taken along the line VI-VI'.

Referring to FIGS. 7 and 8, the first color filter layer 221 may be formed on the second substrate 210. For example, the second substrate 210 may be formed of a transparent resin substrate. The second substrate 210 may include an insulating material such as glass or plastic. Alternatively, the second substrate 210 may include an organic polymer material such as polycarbonate, polyethylene, polypropylene, and the like.

The first color filter layer 221 may overlap the first light emitting area LA1. In addition, the first color filter layer 221 may further overlap the light blocking area BA. That is, a first portion of the first color filter layer 221 may overlap the first light emitting area LA1, and a second portion of the first color filter layer 221 may overlap the light blocking area BA.

The first color filter layer 221 may have the first opening 221a corresponding to the second light emitting area LA2 and the second opening 221b corresponding to the third light emitting area LA3. Accordingly, the first color filter layer 221 may define the second light emitting area LA2 and the third light emitting area LA3.

According to some embodiments, the first color filter layer 221 may be a blue color filter that transmits blue light. For example, the first color filter layer 221 may be formed of a blue pigment and/or a color filter composition including a blue pigment.

Referring to FIGS. 9 and 10, the second color filter layer 222 may be formed on the second substrate 210 and the first color filter layer 221.

The second color filter layer 222 may overlap the second light emitting area LA2. In addition, the second color filter layer 222 may further overlap a portion of the light blocking area BA. That is, a first portion of the second color filter layer 222 may overlap the second light emitting area LA2, and a second portion of the second color filter layer 222 may overlap a portion of the light blocking area BA.

The second color filter layer 222 may have the third opening 222a and the fourth opening 222b. A portion of the third opening 222a may overlap the third light emitting area LA3, and the fourth opening 222b may correspond to the first light emitting area LA1. The width of the third opening 222a may be greater than the width of the second opening 221b. Accordingly, the second color filter layer 222 may define the first light emitting area LA1.

According to some embodiments, the second color filter layer 222 may be a red color filter that transmits red light. For example, the second color filter layer 222 may be formed from a red pigment and/or a color filter composition including a red pigment.

Referring to FIGS. 11 and 12, the third color filter layer 223 may be formed on the second substrate 210 and the second color filter layer 222.

The third color filter layer 223 may overlap the third light emitting area LA3. In addition, the third color filter layer 223 may further overlap a portion of the light blocking area BA. That is, a first portion of the third color filter layer 223 may overlap the third light emitting area LA3, and a second portion of the third color filter layer 223 may overlap a portion of the light blocking area BA.

The third color filter layer 223 may have the fifth opening 223a and the sixth opening 223b. A portion of the fifth opening 223a may overlap the second light emitting area LA2, and a portion of the sixth opening 223b may overlap the first light emitting area LA1. That is, the width of the fifth opening 223a may be greater than the width of the first opening 221a and the width of the sixth opening 223b may be greater than the width of the fourth opening 222b.

According to some embodiments, the third color filter layer 223 may be a green color filter that transmits green light. For example, the third color filter layer 223 may be formed from a green pigment and/or a color filter composition including a green pigment.

Accordingly, the color filter layer 220 including the first color filter layer 221, the second color filter layer 222, and the third color filter layer 223 may be formed on the second substrate 210. That is, the first color filter layer 221, the second color filter layer 222, and the third color filter layer 223 may be sequentially formed.

Figure 13:
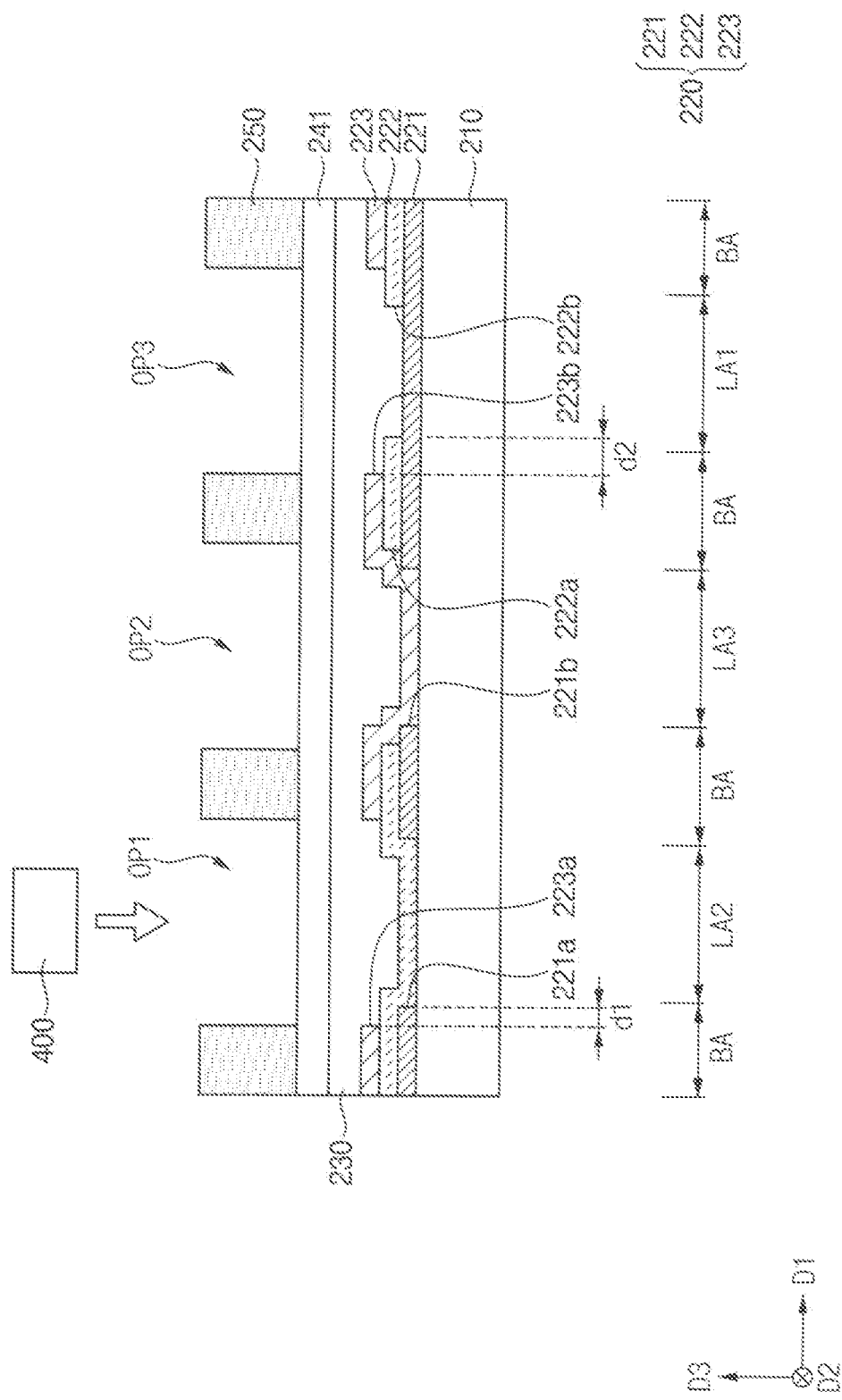
Figure 14:
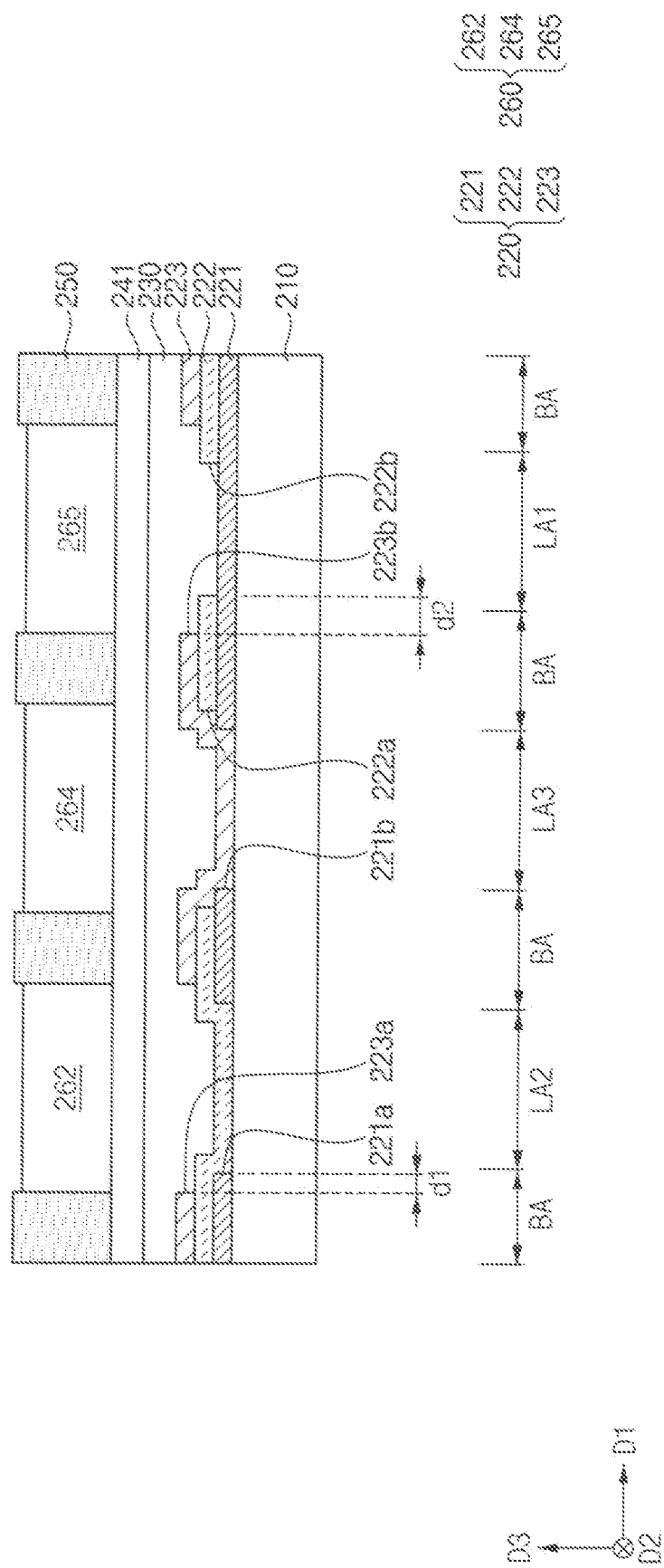

Referring to FIGS. 13 and 14, the low refractive index layer 230 may be formed on the color filter layer 220. The low refractive index layer 230 may cover the color filter layer 220. The low refractive index layer 230 may have a relatively low refractive index. For example, the low refractive index layer 230 may be formed using an organic material.

The first protection layer 241 may be formed on the low refractive index layer 230. The first protection layer 241 may cover the low refractive index layer 230. For example, the first protection layer 241 may be formed using an inorganic material.

The bank structure 250 may be formed on the first protection layer 241. The bank structure 250 may be formed to overlap a portion of the light blocking area BA. For example, the bank structure 250 may include an organic material and the like. In addition, the bank structure 250 may include a light blocking material.

The bank structure 250 may have a first opening area OP1, a second opening area OP2, and a third opening area OP3. A portion of the first opening area OP1 may overlap with the second light emitting area LA2, a portion of the second opening area OP2 may overlap with the third light emitting area LA3, and a portion of the third opening area OP3 may overlap with first light emitting area LA1. Each of the first, second, and third opening areas OP1, OP2, and OP3 may receive an ink composition in a process of forming the color conversion layer 260.

An inkjet apparatus 400 may drop the ink composition onto the first opening area OP1. Here, the ink composition may be a material for forming a color conversion layer.

The first color conversion layer 262 may be formed by the inkjet apparatus 400 repeatedly dropping the ink composition onto the first opening area OP1. In addition, the second color conversion layer 264 may be formed by the inkjet apparatus 400 repeatedly dropping the ink composition onto the second opening area OP2 and the transmission layer 265 may be formed by the inkjet apparatus 400 repeatedly dropping the ink composition onto the third opening area OP3.

Referring back to FIGS. 4, 5, and 6, the second protection layer 242 may be formed on the bank structure 250 and the color conversion layer 260. The second protection layer 242 may cover the color conversion layer 260 and the bank structure 250. For example, the second protection layer 242 may be formed using an inorganic material.

Accordingly, the color conversion substrate 200 illustrated in FIGS. 4, 5 and 6 may be manufactured.

FIGS. 15, 16, 17, 18, 19, 20, and 21 are cross-sectional views illustrating color conversion substrates according to other embodiments.

First, referring to FIGS. 15, 16, 17, 18, 19, and 20, the color conversion substrates 201, 202, 203, 204, 205, and 206 according to other embodiments of the present invention may include a second substrate 210, a color filter layer 220, a low refractive index layer 230, a first protection layer 241, a color conversion layer 260, a bank structure 250, and a second protection layer 242. However, the color conversion substrates 201, 202, 203, 204, 205, and 206 described with reference to FIGS. 15, 16, 17, 18, 19, and 20 may be substantially the same as or similar to the color conversion substrate 200 described with reference to FIGS. 4, 5, and 6 except for a stacking order of color filter layers 221, 222, and 223. Hereinafter, overlapping descriptions will be omitted.

As described above, the first color filter layer 221, the second color filter layer 222, and the third color filter layer 223 may transmit light of different colors with each other. According to some embodiments, the first color filter layer 221 overlapping the first light emitting area LA1 may transmit blue light, the second color filter layer 222 overlapping the second light emitting area LA2 may transmit red light, and the third color filter layer 223 overlapping the third light emitting area LA3 may transmit green light. Accordingly, the first light emitting area LA1 may emit blue light, the second light emitting area LA2 may emit red light, and the third light emitting area LA3 may emit green light.

The first color filter layer 221 may have a first opening 221a and a second opening 221b, the second color filter layer 222 may have a third opening 222a and a fourth opening 222b, and the third color filter layer 223 may have a fifth opening 223a and a sixth opening 223b.

Figure 15:
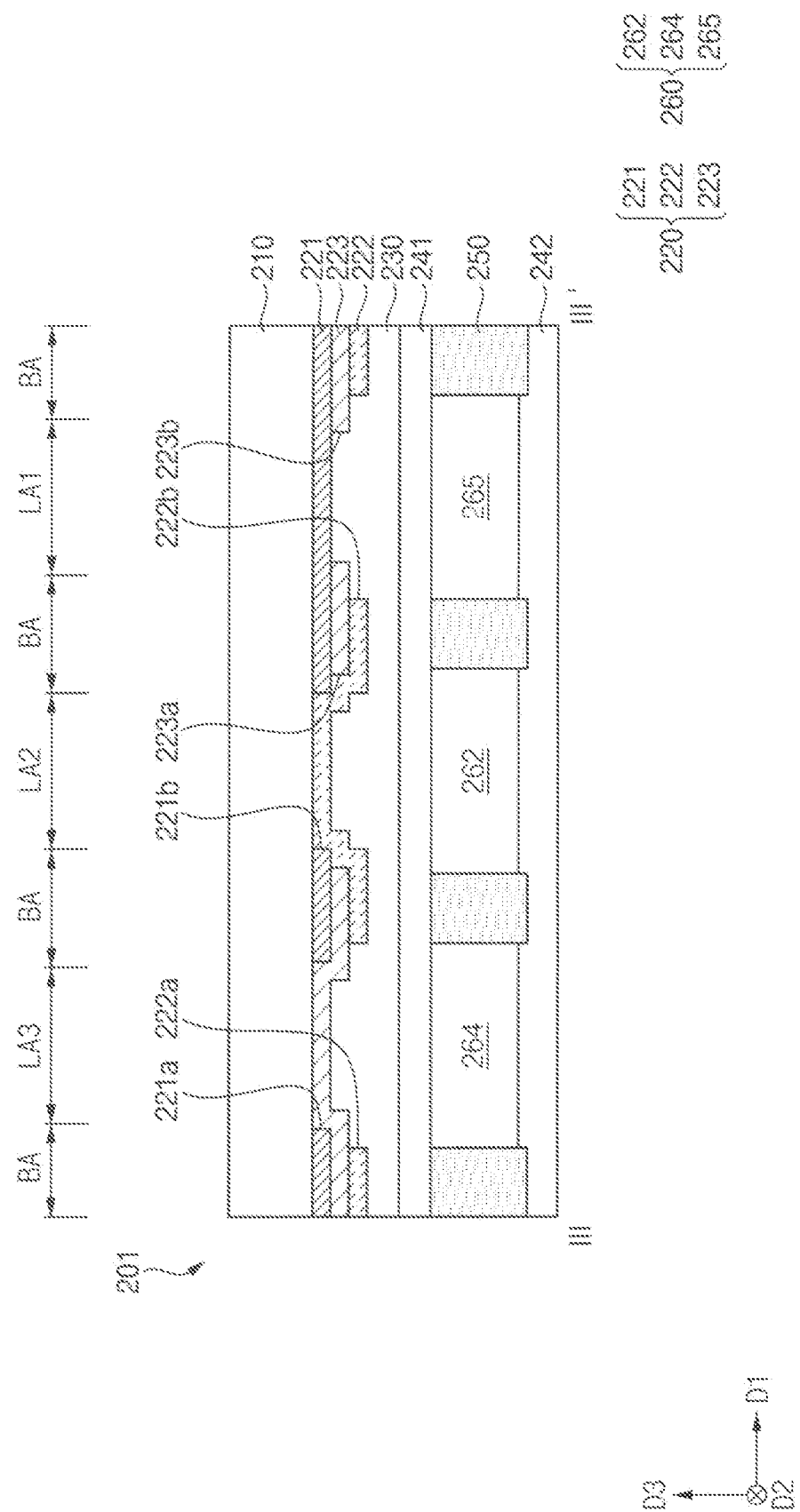
FIGS. 15, 16, 17, 18, 19, 20, and 21 are cross-sectional views illustrating color conversion substrates according to other embodiments.

As shown in FIG. 15, the first color filter layer 221 may be located under the second substrate 210. The third color filter layer 223 may be located under the second substrate 210 and the first color filter layer 221. The second color filter layer 222 may be located under the second substrate 210 and the third color filter layer 223. That is, the first color filter layer 221, the third color filter layer 223, and the second color filter layer 222 may be sequentially arranged under the second substrate 210.

According to some embodiments, the first opening 221a of the first color filter layer 221 may correspond to the third light emitting area LA3 and the second opening 221b of the first color filter layer 221 may correspond to the second light emitting the area LA2. In addition, the sixth opening 223b of the third color filter layer 223 may correspond to the first light emitting area LA1. Accordingly, the first color filter layer 221 may define the second light emitting area LA2 and the third light emitting area LA3, respectively, and the third color filter layer 222 may define the first light emitting area LA1.

Figure 16:
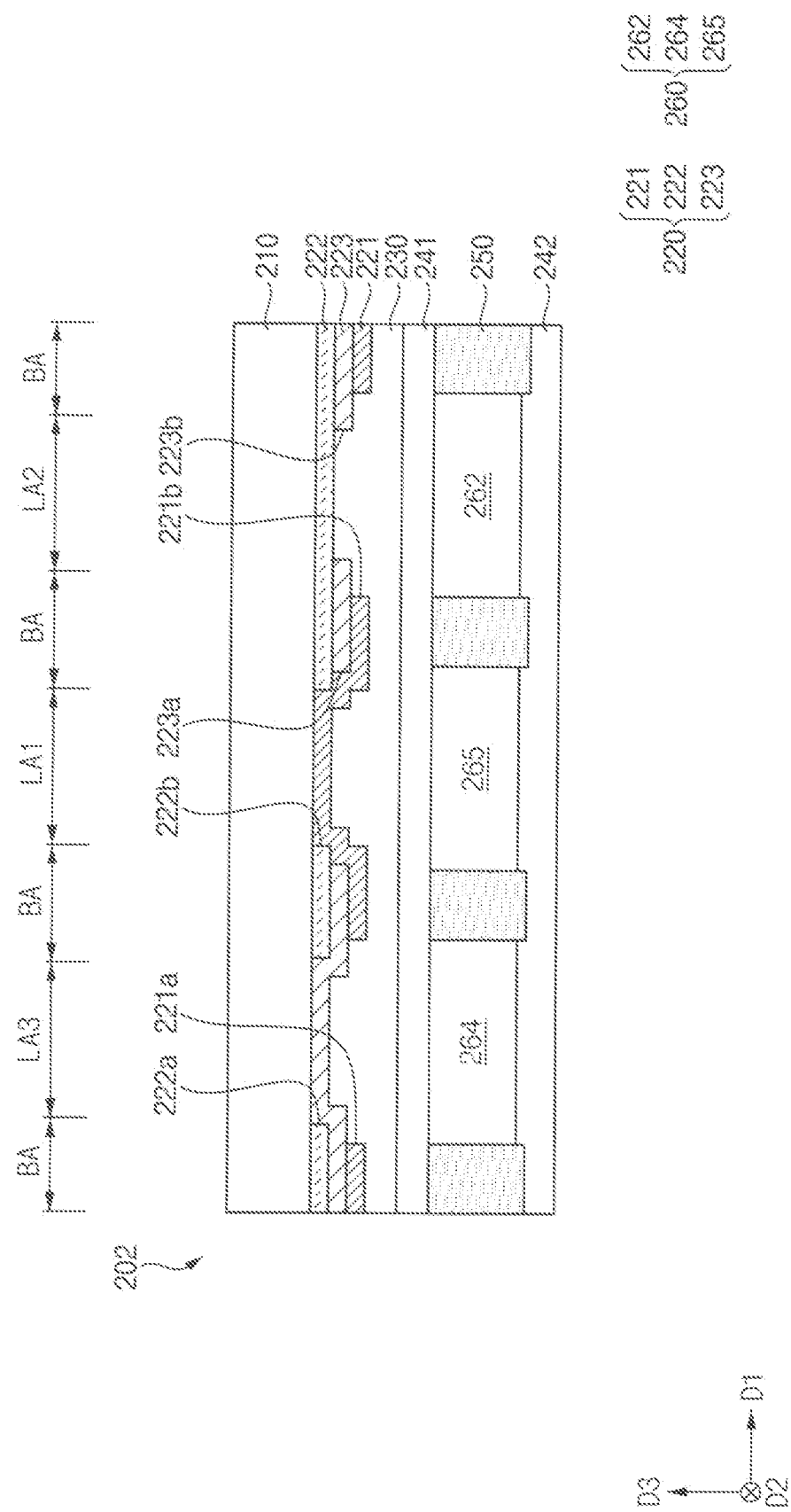

As shown in FIG. 16, the second color filter layer 222 may be located under the second substrate 210. The third color filter layer 223 may be located under the second substrate 210 and the second color filter layer 222. The first color filter layer 221 may be located under the second substrate 210 and the third color filter layer 223. That is, the second color filter layer 222, the third color filter layer 223, and the first color filter layer 221 may be sequentially located under the second substrate 210.

According to some embodiments, the third opening 222a of the second color filter layer 222 may correspond to the third light emitting area LA3, and the fourth opening 222b of the second color filter layer 222 may correspond to the first light emitting area LA1. In addition, the sixth opening 223b of the third color filter layer 223 may correspond to the second light emitting area LA2. Accordingly, the second color filter layer 222 may define the third light emitting area LA3 and the first light emitting area LA1, respectively, and the third color filter layer 222 may define the second light emitting area LA2.

Figure 17:
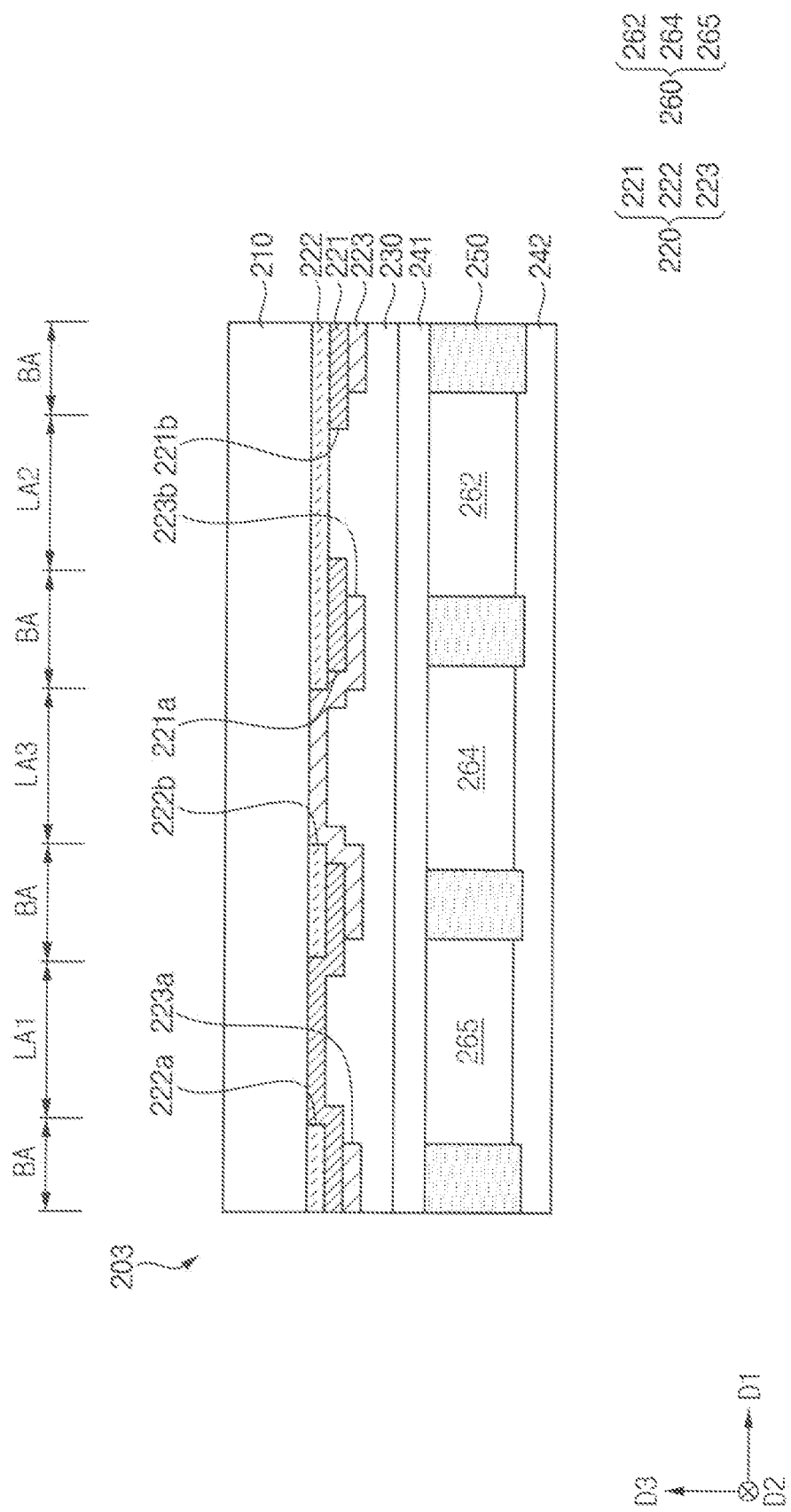

As shown in FIG. 17, the second color filter layer 222 may be located under the second substrate 210. The first color filter layer 221 may be located under the second substrate 210 and the second color filter layer 222. The third color filter layer 223 may be located under the second substrate 210 and the first color filter layer 221. That is, the second color filter layer 222, the first color filter layer 221, and the third color filter layer 223 may be sequentially located under the second substrate 210.

According to some embodiments, the third opening 222a of the second color filter layer 222 may correspond to the first light emitting area LA1, and the fourth opening 222b of the second color filter layer 222 may correspond to the third light emitting area LA3. In addition, the second opening 221b of the first color filter layer 221 may correspond to the second light emitting area LA2. Accordingly, the second color filter layer 222 may define the first light emitting area LA1 and the third light emitting area LA3, respectively, and the first color filter layer 221 may define the second light emitting area LA2.

Figure 18:
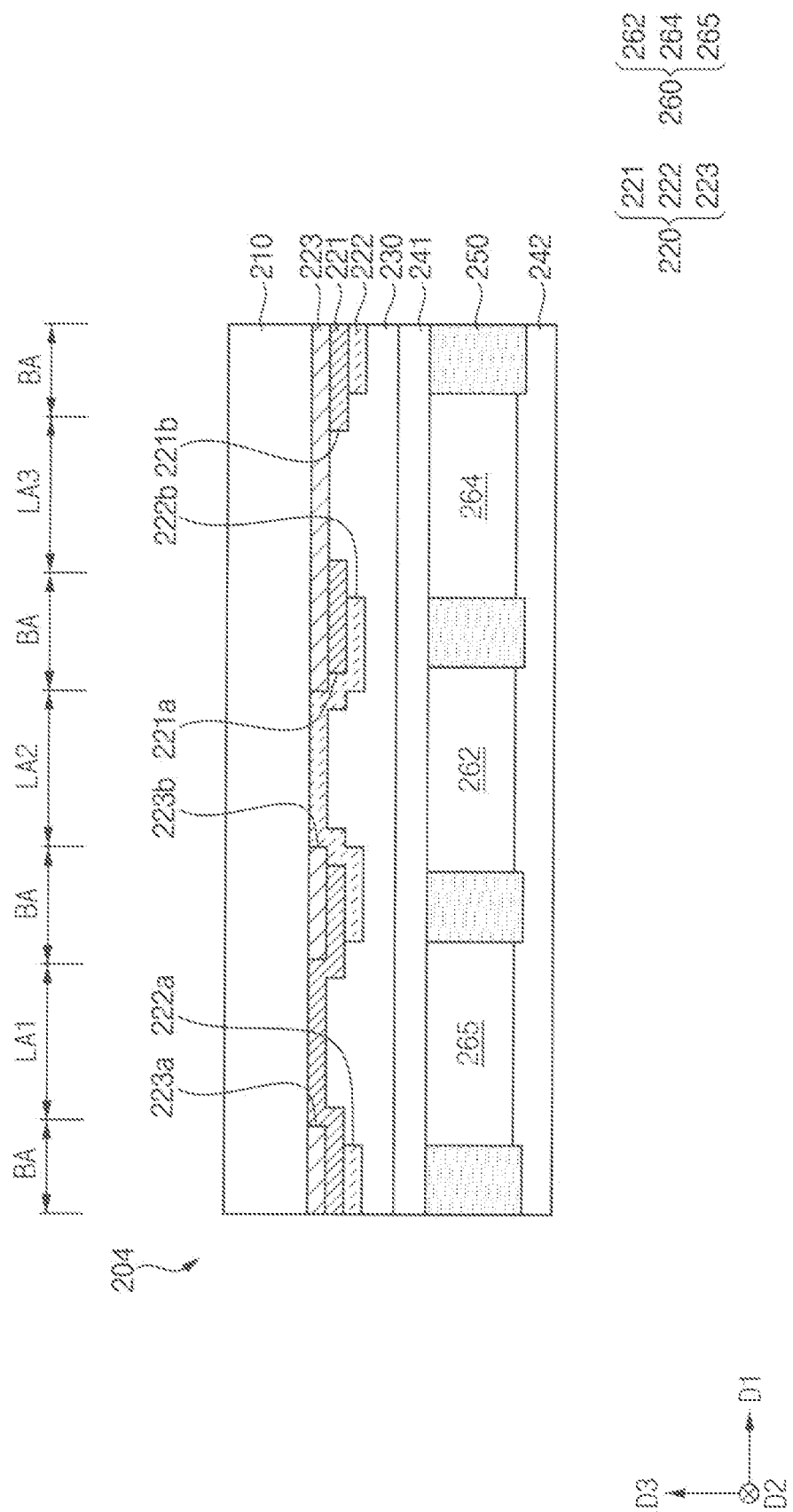

As shown in FIG. 18, the third color filter layer 223 may be located under the second substrate 210. The first color filter layer 221 may be located under the second substrate 210 and the third color filter layer 223. The second color filter layer 222 may be located under the second substrate 210 and the first color filter layer 221. That is, the third color filter layer 223, the first color filter layer 221, and the second color filter layer 222 may be sequentially located under the second substrate 210.

According to some embodiments, the fifth opening 223a of the third color filter layer 223 may correspond to the first light emitting area LA1 and the sixth opening 223b of the third color filter layer 223 may correspond to the second light emitting area LA2. In addition, the second opening 221b of the first color filter layer 221 may correspond to the third light emitting area LA3. Accordingly, the third color filter layer 223 may define the first light emitting area LA1 and the second light emitting area LA2, respectively, and the first color filter layer 221 may define the third light emitting area LA3.

Figure 19:
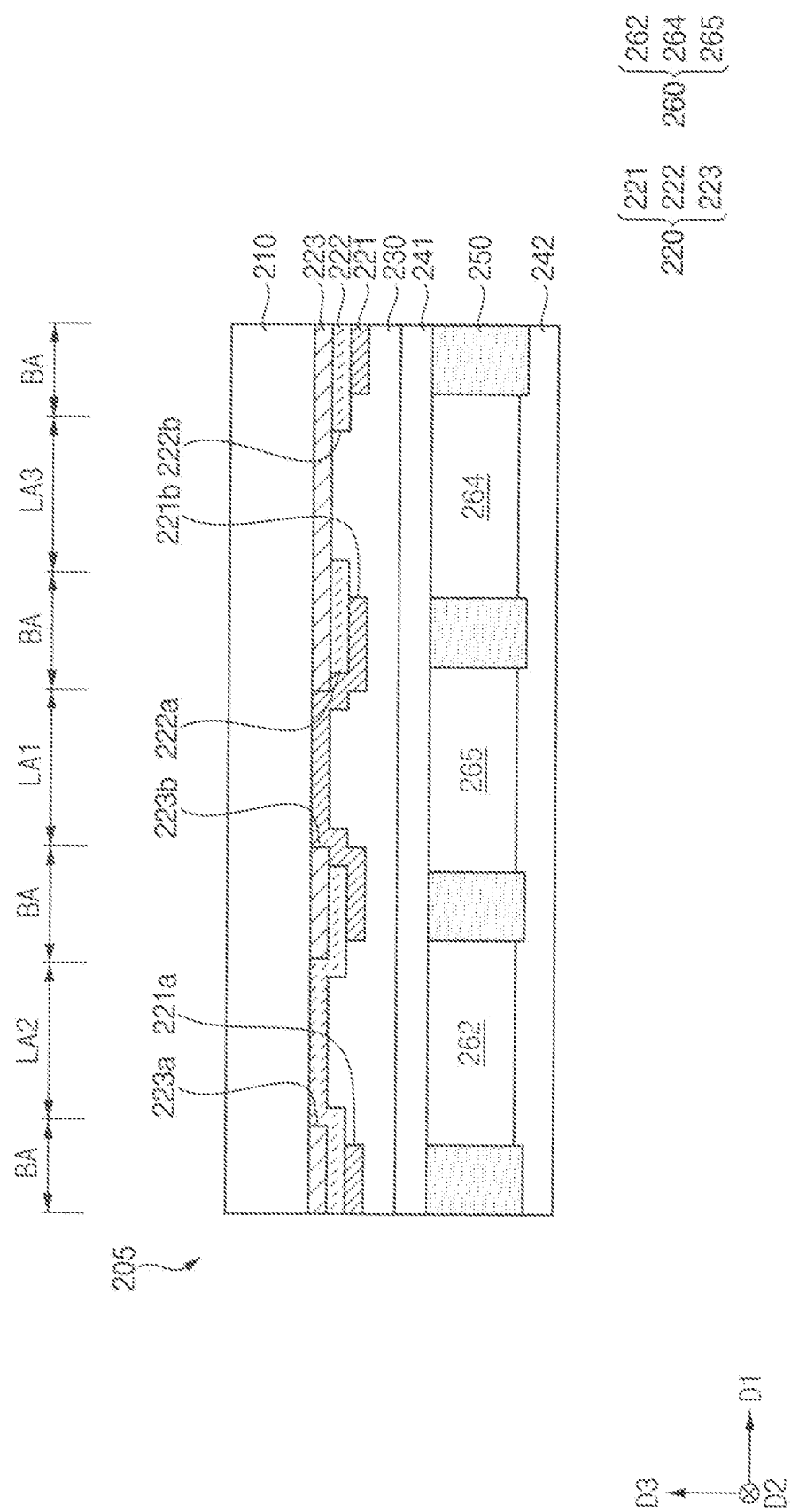

As shown in FIG. 19, the third color filter layer 223 may be located under the second substrate 210. The second color filter layer 222 may be located under the second substrate 210 and the third color filter layer 223. The first color filter layer 221 may be located under the second substrate 210 and the second color filter layer 222. That is, the third color filter layer 223, the second color filter layer 222, and the first color filter layer 221 may be sequentially located under the second substrate 210.

According to some embodiments, the fifth opening 223a of the third color filter layer 223 may correspond to the second light emitting area LA2 and the sixth opening 223b of the third color filter layer 223 may correspond to the first light emitting area LA1. In addition, the fourth opening 222b of the second color filter layer 222 may correspond to the third light emitting area LA3. Accordingly, the third color filter layer 223 may define the second light emitting area LA2 and the first light emitting area LA1, respectively, and the first color filter layer 221 may define the third light emitting area LA3.

Figure 20:
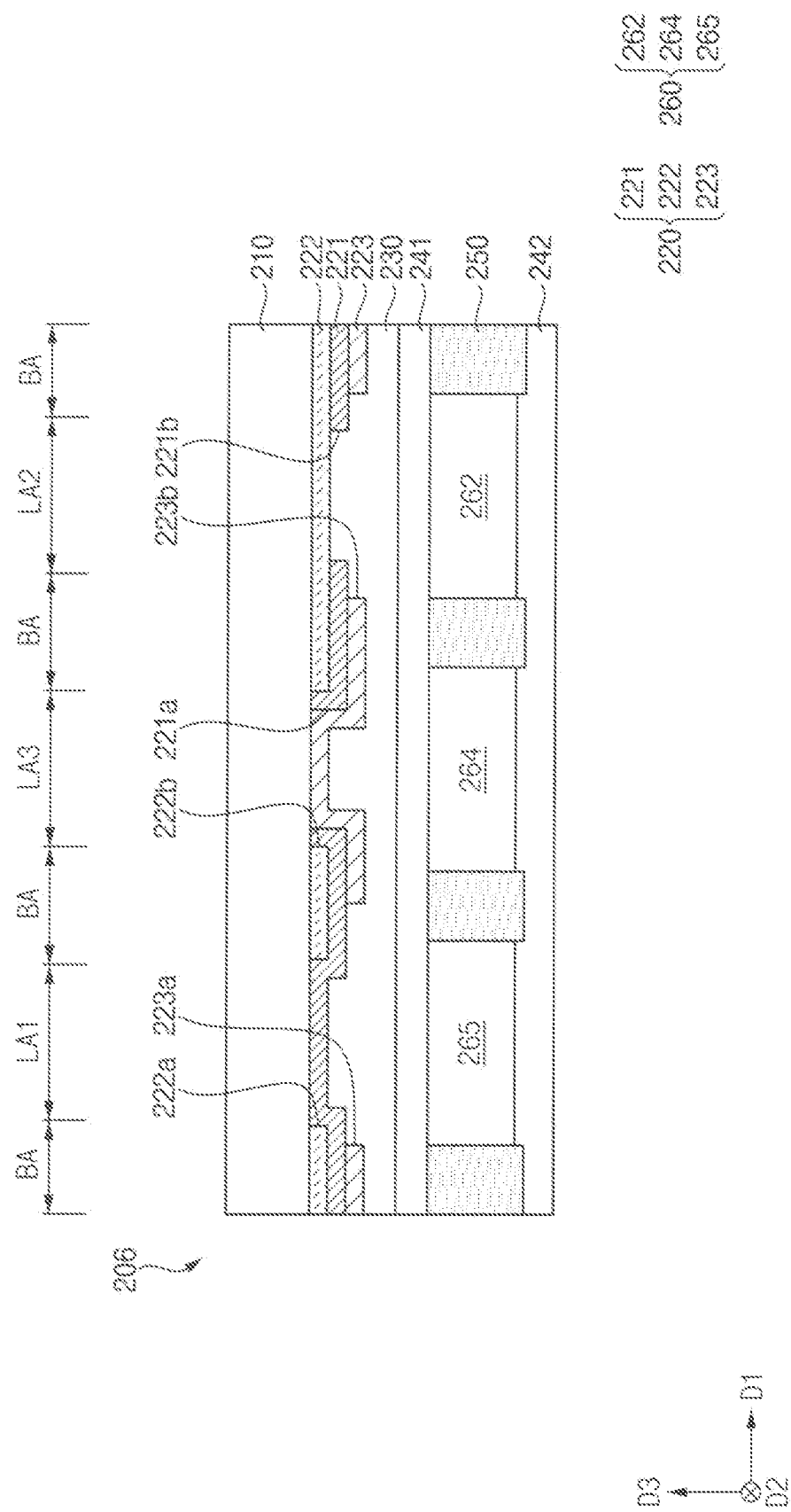

As shown in FIG. 20, the second color filter layer 222 may be located under the second substrate 210. The first color filter layer 221 may be located under the second substrate 210 and the second color filter layer 222. The third color filter layer 223 may be located under the second substrate 210 and the first color filter layer 221. That is, the second color filter layer 222, the first color filter layer 221, and the third color filter layer 223 may be sequentially located under the second substrate 210.

According to some embodiments, the third opening 222a of the second color filter layer 222 may correspond to the first light emitting area LA2. In addition, the first opening 221a of the first color filter layer 221 may correspond to the third light emitting area LA3 and the second opening 221b of the first color filter layer 221 may correspond to the second light emitting area LA2. Accordingly, the second color filter layer 222 may define the first light emitting area LA1, and the first color filter layer 221 may define the third light emitting area LA3 and the second light emitting area LA2, respectively.

Figure 21:
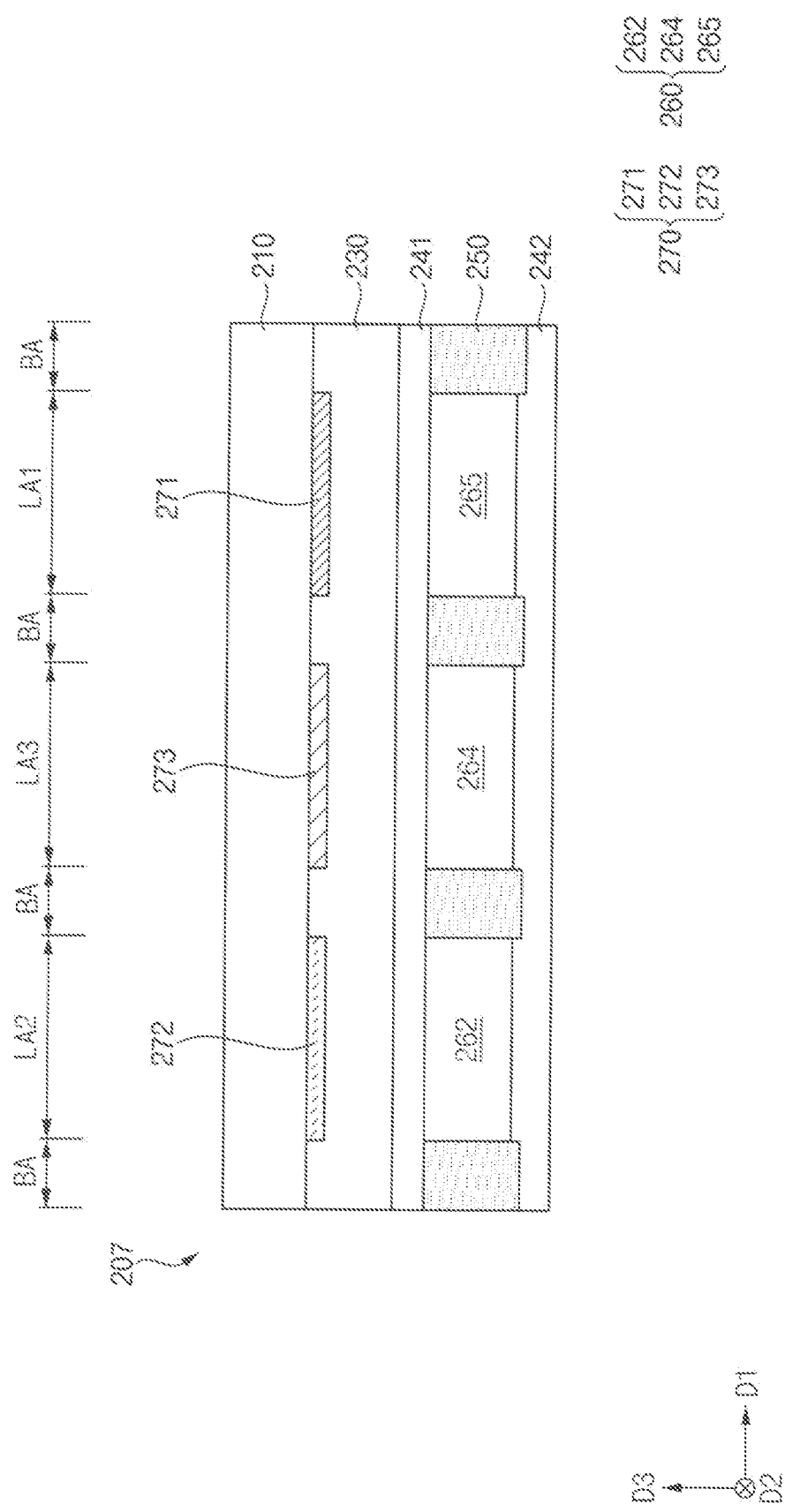

Referring to FIG. 21, the color conversion substrate 207 according to some embodiments of the present invention includes a second substrate 210, a color filter layer 270, a low refractive index layer 230, a first protection layer 241, a color conversion layer 260, a bank structure 250, and a second protection layer 242. However, the color conversion substrate 207 described with reference to FIG. 21 may be substantially the same as or similar to the color conversion substrate 200 described with reference to FIGS. 4, 5, and 6 except for the color filter layer 270. Hereinafter, overlapping descriptions will be omitted.

The color filter layer 270 may be located under the second substrate 210. The color filter layer 270 may include a first color filter layer 271, a second color filter layer 272, and a third color filter layer 273. According to some embodiments, the first color filter layer 271 may overlap the first light emitting area LA1, the second color filter layer 272 may overlap the second light emitting area LA2, and the third color filter layer 273 may overlap the third light emitting area LA3. That is, the first, second, and third color filter layers 271, 272, and 273 may not overlap the light blocking area BA.

According to some embodiments, the bank structure 250 may overlap only the light blocking area BA without overlapping the first, second, and third light emitting areas LA1, LA2, and LA3. That is, the bank structure 250 may define first, second, and third light emitting areas LA1, LA2, and LA3.

Figure 22:
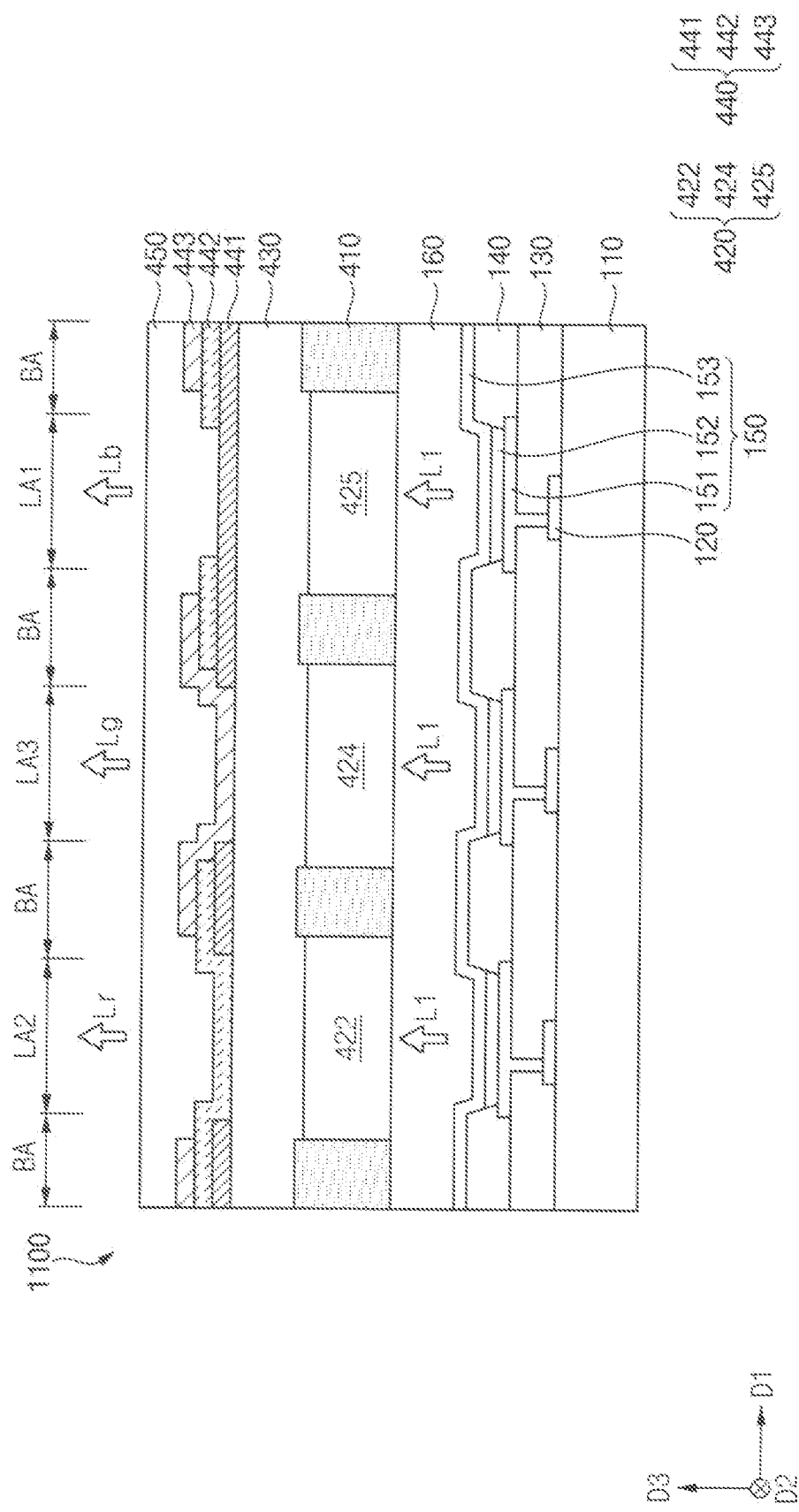
FIG. 22 is a cross-sectional view illustrating a display device according to some embodiments.

FIG. 22 is a cross-sectional view illustrating a display device according to some embodiments.

Referring to FIG. 22, the display device 1100 according to some embodiments may include a first substrate 110, a driving element 120, an insulating structure 130, a pixel defining layer 140, a light emitting element 150, an encapsulation structure 160, a bank structure 410, a color conversion layer 420, a low refractive index layer 430, a color filter layer 440, and a protection layer 450. Hereinafter, a description overlapping with the display device 1000 described with reference to FIG. 4 will be omitted.

The display device 1100 according to some embodiments of the present invention may have a single substrate structure. For example, the color conversion layer 420 may be located on the encapsulation structure 160. The color conversion layer 420 may include a color conversion particle.

The color conversion layer 420 may include a first color conversion layer 422, a second color conversion layer 424, and a transmission layer 425. The first color conversion layer 422 may partially overlap the second light emitting area LA2, the second color conversion layer 424 may partially overlap the third light emitting area LA3, and the transmission layer 425 may partially overlap the first light emitting area LA1.

The first color conversion layer 422 may include a first color conversion particle. In addition, the first color conversion layer 422 may further include a first photosensitive polymer in which first scattering particles are dispersed. The second color conversion layer 424 may include a second color conversion particle. In addition, the second color conversion layer 424 may further include a second photosensitive polymer in which second scattering particles are dispersed. Each of the first color conversion particle and the second color conversion particle may denote a quantum dot. The transmission layer 425 may include a third photosensitive polymer in which third scattering particles are dispersed. For example, each of the first, second, and third photosensitive polymers may include an organic material having light transmittance, such as a silicone resin, an epoxy resin, and the like. The first, second, and third photosensitive polymers may include the same material. The first, second, and third scattering particles may include the same material.

The bank structure 410 may be located on the encapsulation structure 160. The bank structure 410 may surround the color conversion layer 420. A space for accommodating an ink composition may be formed in the bank structure 410 in a process of forming the color conversion layer 420. In addition, the bank structure 410 may overlap a portion of the light blocking area BA. For example, the bank structure 410 may include a light blocking material.

The low refractive index layer 430 may be located on the bank structure 410 and the color conversion layer 420. The low refractive index layer 430 may have a relatively low refractive index. For example, a refractive index of the low refractive index layer 430 may be lower than a refractive index of the color conversion layer 420. The low refractive index layer 430 may include an organic material. For example, the low refractive index layer 430 may include an organic polymer material including silicon.

The color filter layer 440 may be located on the low refractive index layer 430. The color filter layer 440 may include a first color filter layer 441, a second color filter layer 442, and a third color filter layer 443.

The first color filter layer 441 may include a first transmitting portion overlapping the first light emitting area LA1 and a first light blocking portion overlapping the light blocking area BA. According to some embodiments, the first light blocking portion of the first color filter layer 441 may be entirely located in the light blocking area BA.

The second color filter layer 442 may include a second transmitting portion overlapping the second light emitting area LA2 and a second light blocking portion overlapping a portion of the light blocking area BA. In addition, the third color filter layer 443 may include a third transmission portion overlapping the third light emitting area LA3 and a third light blocking portion overlapping a portion of the light blocking area BA.

The protection layer 450 may be located on the color filter layer 440. The protection layer 450 may cover the color filter layer 440. For example, the protection layer 450 may include an inorganic material or an organic material. Examples of the inorganic material that can be used as the protection layer 450 may include silicon oxide, silicon nitride, silicon oxynitride, and the like. These may be used alone or in combination with each other.

Aspects of embodiments according to the present disclosure can be applied to various display devices that may include a display device. For example, embodiments according to the present disclosure can be applied to high-resolution smartphones, mobile phones, smart pads, smart watches, tablet PCs, in-vehicle navigation systems, televisions, computer monitors, notebook computers, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, and their equivalents.

What is claimed is:

1. A color conversion substrate comprising:
   a substrate including first, second, and third light emitting areas, and a light blocking area surrounding the first, second, and third light emitting area;
   a first color filter layer under the substrate, overlapping the first light emitting area, and having a first opening and a second opening exposing a portion of the substrate, respectively;
   a second color filter layer under the substrate and the first color filter layer, overlapping the second light emitting area, and having a third opening exposing a portion of the substrate and a fourth opening exposing a portion of the first color filter layer;
   a third color filter layer under the substrate and the second color filter layer, overlapping the third light emitting area, and having a fifth opening exposing a portion of the second color filter layer and a sixth opening exposing a portion of the first color filter layer; and
   a color conversion layer overlapping the first, second, and third color filter layers under the first, second, and third color filter layers and including a color conversion particle,
   wherein a first shortest distance from an end of the first opening to an end of the fifth opening is different from a second shortest distance from an end of the fourth opening to an end of the sixth opening in a plan view,
   wherein the second shortest distance is greater than the first shortest distance.

2. The color conversion substrate of claim 1, wherein the first color filter layer, the second color filter layer, and the third color filter layer partially overlap with each other in the light blocking area.

3. The color conversion substrate of claim 1, wherein the first color filter layer, the second color filter layer, and the third color filter layer transmit light of different colors with each other.

4. The color conversion substrate of claim 3, wherein the first color filter layer is configured to transmit blue light, the second color filter layer is configured to transmit red light, and the third color filter layer is configured to transmit green light.

5. The color conversion substrate of claim 3, wherein the first opening corresponds to the second light emitting area, the second opening corresponds to the third light emitting area, and the fourth opening corresponds to the first light emitting area.

6. The color conversion substrate of claim 3, wherein a portion of the third opening overlaps the third light emitting area, a portion of the fifth opening overlaps the second light emitting area, and a portion of the sixth opening overlaps the first light emitting area.

7. The color conversion substrate of claim 3, wherein a width of the first opening is smaller than a width of the fifth opening, a width of the second opening is smaller than a width of the third opening, and a width of the fourth opening is smaller than a width of the sixth opening.

8. The color conversion substrate of claim 1, wherein the first color filter layer includes a portion overlapping the first light emitting area and a portion overlapping the light blocking area,
   wherein the second color filter layer includes a portion overlapping the second light emitting area and a portion overlapping a portion of the light blocking area, and
   wherein the third color filter layer includes a portion overlapping the third light emitting area and a portion overlapping a portion of the light blocking area.

9. The color conversion substrate of claim 1, wherein the color conversion layer includes:
   a first color conversion layer partially overlapping the second light emitting area;

a second color conversion layer partially overlapping the third light emitting area; and a transmission layer partially overlapping the first light emitting area.

10. A color conversion substrate comprising:
a substrate including first, second, and third light emitting areas, and a light blocking area surrounding the first, second, and third light emitting area;
a first color filter layer under the substrate, overlapping the first light emitting area, and having a first opening exposing a portion of the substrate;
a second color filter layer under the substrate and the first color filter layer, overlapping the second light emitting area, and having a second opening exposing a portion of the first color filter layer; and
a third color filter layer under the substrate and the second color filter layer, overlapping the first light emitting area, and having a third opening exposing a portion of the second color filter layer and a fourth opening exposing a portion of the first color filter layer,
wherein a first shortest distance from an end of the first opening to an end of the third opening is different from a second shortest distance from an end of the second opening to an end of the fourth opening in a plan view,
wherein the second shortest distance is greater than the first shortest distance.

11. The color conversion substrate of claim 10, further comprising:
a color conversion layer overlapping the first, second, and third color filter layers under the first, second, and third color filter layers and including a color conversion particle.

12. The color conversion substrate of claim 10, wherein a width of the first opening is smaller than a width of the third opening and a width of the second opening is smaller than a width of the fourth opening.

13. A display device comprising:
an array substrate including a first substrate and a light emitting element on the first substrate; and
a color conversion substrate on the array substrate and converting a wavelength of light emitted from the light emitting element,
wherein the color conversion substrate includes:
a second substrate including first, second, and third light emitting areas, and a light blocking area surrounding the first, second, and third light emitting area;
a first color filter layer under the second substrate, overlapping the first light emitting area, and having a first opening and a second opening exposing a portion of the second substrate, respectively;
a second color filter layer under the second substrate and the first color filter layer, overlapping the second light emitting area, and having a third opening exposing a portion of the second substrate and a fourth opening exposing a portion of the first color filter layer;
a third color filter layer under the second substrate and the second color filter layer, overlapping the third light emitting area, and having a fifth opening exposing a portion of the second color filter layer and a sixth opening exposing a portion of the first color filter layer; and
a color conversion layer overlapping the first, second, and third color filter layers under the first, second, and third color filter layers and including a color conversion particle,
wherein a first shortest distance from an end of the first opening to an end of the fifth opening is different from a second shortest distance from an end of the fourth opening to an end of the sixth opening in a plan view,
wherein the second shortest distance is greater than the first shortest distance.

14. The display device of claim 13, wherein a stacked portion in which the first color filter layer, the second color filter layer, and the third color filter layer are overlapped in the light blocking area is defined as a light blocking layer.

15. The display device of claim 13, wherein the first color filter layer, the second color filter layer, and the third color filter layer transmit light of different colors with each other.

16. The display device of claim 15, wherein the first opening corresponds to the second light emitting area, the second opening corresponds to the third light emitting area, and the fourth opening corresponds to the first light emitting area.

17. The display device of claim 15, wherein a portion of the third opening overlaps the third light emitting area, a portion of the fifth opening overlaps the second light emitting area, and a portion of the sixth opening overlaps the first light emitting area.

18. The display device of claim 13, wherein the first color filter layer includes a portion overlapping the first light emitting area and a portion overlapping the light blocking area,
wherein the second color filter layer includes a portion overlapping the second light emitting area and a portion overlapping a portion of the light blocking area, and
wherein the third color filter layer includes a portion overlapping the third light emitting area and a portion overlapping a portion of the light blocking area.

19. The display device of claim 13, wherein the light emitting element is configured to emit light including blue light.

* * * * *